US 6,721,371 B1

(12) United States Patent
Barham et al.

(10) Patent No.: US 6,721,371 B1
(45) Date of Patent: Apr. 13, 2004

(54) ONE SAMPLE PER SYMBOL HIGH RATE PROGRAMMABLE PARALLEL ARCHITECTURE FOR DIGITAL DEMODULATION

(75) Inventors: Steven T Barham, Taylorsville, UT (US); Zachary C Bagley, Salt Lake City, UT (US); Lyman D Horne, Salt Lake City, UT (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 09/477,882

(22) Filed: Jan. 5, 2000

Related U.S. Application Data

(63) Continuation-in-part of application No. 09/257,436, filed on Feb. 25, 1999.

(51) Int. Cl.[7] .............................................. H04L 27/22
(52) U.S. Cl. ..................... 375/316; 375/260; 370/536; 370/542; 329/327; 329/363
(58) Field of Search ...................... 375/130, 143–144, 375/147, 148–150, 260, 271, 275, 280, 316, 322, 325, 340, 343, 355, 362, 367; 329/315–316, 323, 327, 341, 345, 346, 358, 363; 370/320, 328, 335, 342, 344, 441, 480, 481, 484, 515, 516, 535, 536, 537, 542, 543, 544; 455/313, 314, 334–335, 338, 337

(56) References Cited

U.S. PATENT DOCUMENTS 4,387,459 A * 6/1983 Huffman ..................... 370/505
4,638,476 A * 1/1987 Acampora et al. .......... 370/421
4,755,763 A * 7/1988 Yoshida ...................... 329/309
5,293,382 A * 3/1994 Carson et al. ............... 370/210
5,412,352 A 5/1995 Graham ....................... 332/103
5,440,265 A 8/1995 Cochran et al. ............. 329/300
5,533,023 A * 7/1996 Ohlson et al. ............... 370/319
5,546,401 A * 8/1996 Lee et al. .................... 370/517
5,640,424 A 6/1997 Banavong et al. ........... 375/316

(List continued on next page.)

Primary Examiner—Khai Tran
Assistant Examiner—Khanh Cong Tran
(74) Attorney, Agent, or Firm—Perman & Green, LLP

(57) ABSTRACT

A high speed demodulator system is comprised of an analog to digital converter (ADC); a high speed demultiplexer connected to an input of the ADC; a bank of parallel programmable demodulators connected to an output of the high speed demultiplexer; a timing interface connected to the bank of parallel programmable demodulators; and a phase reference interface connected to the bank of parallel programmable demodulators and a data processor. A parallel programmable demodulator includes a reconfigurable FIR filter, has an input port for receiving digital input signals and an output coupled to a coherent signal processor and a coherent memory. The programmable FIR filter provides filtered signals to the coherent signal processor for storage in the coherent memory. The integrated circuit further includes a sequential weight processor having an input coupled to an output of the coherent memory. The sequential weight processor includes a weight memory and operates to output symbol soft decision data resulting from processing the digital input signals. The integrated circuit is programmable into one of a plurality of operating modes, including at least one of a received signal acquisition mode, a channel estimator mode, an adaptive equalizer mode, and a channel-wise differential mode.

20 Claims, 22 Drawing Sheets

U.S. PATENT DOCUMENTS

| | | | | |
|---|---|---|---|---|
| 5,663,962 | A | * 9/1997 | Caire et al. | 370/535 |
| 5,696,797 | A | 12/1997 | Bucher et al. | 375/344 |
| 5,719,899 | A | * 2/1998 | Thielecke et al. | 375/144 |
| 5,751,724 | A | * 5/1998 | Elliott | 370/536 |
| 5,809,422 | A | * 9/1998 | Raleigh et al. | 455/449 |
| 5,903,550 | A | * 5/1999 | Spock | 370/335 |
| 6,034,974 | A | * 3/2000 | Matsuoka et al. | 370/542 |
| 6,055,280 | A | * 4/2000 | Genrich | 375/325 |
| 6,097,766 | A | * 8/2000 | Okubo et al. | 375/324 |
| 6,137,785 | A | * 10/2000 | Bar-Ness | 370/328 |
| 6,172,994 | B1 | * 1/2001 | Schaffner et al. | 370/529 |
| 6,198,754 | B1 | * 3/2001 | Nakayama | 370/536 |
| 6,310,865 | B1 | * 10/2001 | Ohki | 370/311 |
| 6,356,581 | B1 | * 3/2002 | Nguyen et al. | 375/148 |
| 6,363,262 | B1 | * 3/2002 | McNicol | 455/561 |
| 6,480,534 | B1 | * 11/2002 | Gatherer et al. | 375/229 |

* cited by examiner

| DELTA TAPES | MODES | N DELAY | INDEX i | SWITCHES |
|---|---|---|---|---|
| 1 | 1R | 0 | 0,1,...,15 | $A_i$ REST OFF |
| | | 1 | | ALL OFF |
| 2 | 1C, 2R | 0 | 0,2,...,14 | $B_i$, $A_{i+1}$, ALL C,D,E OFF |
| | | 1 | | $B_i$, $\bar{A}_{i+1}$, ALL C,D,E OFF |
| | | 2 | | $\bar{B}_i$, $A_i$, $\bar{A}_{i+1}$, ALL C,D,E OFF |
| | | 3 | | $\bar{B}_i$, $\bar{A}_i$, $\bar{A}_{i+1}$, ALL C,D,E OFF |
| 4 | 2C, 4R | 0 | 0,4,8,12 | $C_i$, $B_{i+2}$, $A_{i+3}$, ALL D,E OFF |
| | | 1-4 | | $\bar{C}_i$, $B_{i+2}$, $A_{i+3}$, ALL D,E OFF<br>($B_i$, $A_i$, $A_{i+1}$) PER Δ 2 DELAY N-1 |
| | | 5-7 | | $\bar{C}_i$, $\bar{B}_{i+2}$, $\bar{A}_{i+2}$, $A_{i+3}$<br>($B_i$, $A_i$, $A_{i+1}$) PER Δ 2 DELAY N-4 |
| 8 | 4C, 3R | 0 | 0,8 | $D_i$, $C_{i+4}$, $B_{i+6}$, $A_{i+7}$, $\bar{E}$ |
| | | 1-8 | | $\bar{D}_i$, $C_{i+4}$, $B_{i+6}$, $A_{i+7}$, $\bar{E}$<br>ALL $CBA_{i+h}$, h<4, PER Δ 4 DELAY N-1 |
| | | 9-15 | | $\bar{D}_i$, $\bar{C}_{i+4}$, $\bar{B}_{i+4}$, $\bar{B}_{i+6}$, $\bar{A}_{i+4}$, $\bar{A}_{i+5}$, $\bar{A}_{i+6}$, $\bar{A}_{i+7}$, $\bar{E}$<br>ALL $CBA_{i+k}$, k<4, PER Δ 4 DELAY N-8 |
| 16 | 8C | 0 | 0 | E, $D_8$, $C_{12}$, $B_{14}$, $A_{15}$ |
| | | 1-16 | | $\bar{E}$, $D_8$, $C_{12}$, $B_{14}$, $A_{15}$<br>ALL $DCBA_{i+k}$, k<8 PER Δ 8 DELAY N-1 |
| | | 17-31 | | $\bar{E}$, $\bar{D}_8$, i All $CBA_k$, k>7 OFF<br>ALL $DCBA_k$, h<8 PER Δ 8 DELAY N-16 |

FIG. 9

| MODE | OUTPUT | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 1R | 0 | 1 | 2 | 3 | 4 | 5 | 6 | 7 | 8 | 9 | 10 | 11 | 12 | 13 | 14 | 15 |
| 1C | j1 | 1 | j3 | 3 | j5 | 5 | j7 | 7 | 8 | 9 | j11 | 11 | j13 | 13 | j15 | 15 |
| 2R | 0 | 3 | 1 | 3 | 5 | 7 | 5 | 7 | j9 | 11 | 9 | 11 | 13 | 15 | j15 | 15 |
| 2C | j3 | 3 | j3 | 3 | j7 | 7 | j7 | 7 | j11 | 11 | j11 | 11 | j15 | 15 | j15 | 15 |
| 4R | 3 | 7 | 3 | 7 | 3 | 7 | 3 | 7 | j11 | 15 | 11 | 15 | 11 | 15 | 11 | 15 |
| 4C | j7 | 7 | j7 | 7 | j7 | 7 | j7 | 7 | j15 | 15 | j15 | 15 | j15 | 15 | j15 | 15 |
| 8R | 7 | 15 | 7 | 15 | 7 | 15 | 7 | 15 | 7 | 15 | 7 | 15 | 7 | 15 | 7 | 15 |
| 8C | j15 | 15 | j15 | 15 | j15 | 15 | j15 | 15 | j15 | 15 | j15 | 15 | j15 | 15 | j15 | 15 |
| WEIGHTS | x1 | x2,1 | | x1 | x4,1 | | x2,1 | | x1 | x2,1 | | x1 | x4,1 | | x2,1 | |
| | | | | | x1 | | | | | | | x1 | | | | |
| | | | | | | | | | | | | x16,1 | | | | |

ONE SAMPLE PER SYMBOL HIGH RATE PROGRAMMABLE PARALLEL ARCHITECTURE FOR DIGITAL DEMODULATION

CROSS REFERENCE TO RELATED APPLICATION

This application is a continuation-in-part of application Ser. No. 09/257,436 filed on Feb. 25, 1999.

BACKGROUND OF THE INVENTION

1. Field of the Invention

This invention relates generally to an integrated circuit used for receiving communication signals and, in particular, relates to multiple externally programmable integrated circuits used for acquiring and parallel demodulation of radio data communication signals.

2. Prior Art

Modern communication systems, such as Code Division Multiple Access and Time Divisional Multiple Access digital radio communication systems, are typically required to maintain low error rates at high data rates through radio paths that are subject to fading, multipath, and other RF impairments. It is also desirable in many applications to provide the radio receiver in a small, possibly portable package, that makes extensive use of integrated circuit technology. In addition it is also desirable to be able to rapidly demodulate any signal constellation the integrated circuit is capable of demodulating. However, the demodulation of a signal constellation is limited by the rate at which an integrated circuit demodulator may be clocked.

OBJECTS AND ADVANTAGES OF THE INVENTION

It is a first object and advantage of this invention to provide an improved demodulator system capable of demodulating a waveform with a baud rate higher than the highest rate of a single demodulator.

It is a further object and advantage of this invention to provide an array of integrated circuit demodulators where each demodulator comprises a reconfigurable FIR filter in combination with a coherent signal processor, a multi-ported coherent memory, a sequential weight processor, and a dual ported weight memory, all of which can be programmed during use for operating in one of a plurality of modes, including a received signal acquisition mode, a channel estimator mode, an adaptive equalizer mode, and a channel-wise differential mode. In addition to the array of parallel integrated circuit demodulators it is a further object and advantage of this invention to provide a one sample per symbol timing interface and a phase reference interface.

SUMMARY OF THE INVENTION

A high speed demodulator system in accordance with this invention includes an analog to digital converter (ADC); a high speed demultiplexer connected to an input of the ADC; a bank of parallel programmable demodulators connected to an output of the high speed demultiplexer; a timing interface connected to the bank of parallel programmable demodulators; and a phase reference interface connected to the bank of parallel programmable demodulators and a data processor. A programmable demodulator in accordance with this invention includes a reconfigurable FIR filter that has an input port for receiving digital input signals and an output coupled to a coherent signal processor and a multi-ported coherent memory. The FIR filter programmably provides filtered signals to the coherent signal processor for storage in the coherent memory. The integrated circuit further includes a an adaptive sequential weight processor having an input coupled to an output port of the coherent memory. The sequential weight processor includes a weight memory and operates to output symbol soft decision data resulting from processing the digital input signals. The integrated circuit is programmable into one of a plurality of operating modes, including at least one of a received signal acquisition mode, a channel estimator mode, an adaptive equalizer mode, and a channel-wise differential mode. Polyphase operation is also within the capabilities of the integrated circuit. In the acquisition mode the FIR filter can be used, in combination with a weight ring and a weight mask, as a PN correlator.

A method for acquiring information signals from a stream of analog signals, the method comprising steps of: digitizing the stream of analog signals to provide a stream of digitized signals; demultiplexing the stream of digitized signals to an array of programmable demodulators demodulating the demultiplexed stream of digital signals through the array of programmable ASICs, and collecting and synchronizing the plurality of outputs of the array of programmable demodulators.

A method of high rate demodulation of a series of modulated analog signals, the method comprising steps of: acquiring and digitizing a series of modulated analog signals; providing parallel programmable demodulation of the digitized series of modulated analog signals; providing a plurality of parallel demodulated data; and reorganizing the demodulated data.

BRIEF DESCRIPTION OF THE DRAWINGS

The foregoing aspects and other features of the present invention are explained in the following description, taken in connection with the accompanying drawings, wherein:

FIG. 9 is a diagram that is useful in understanding the various configurations of the FIR input registers shown in FIGS. 8A and 8B;

FIG. 11 is a diagram that is useful in understanding the operation of the FIR filter switch matrix of FIG. 10;

FIG. 14 is a diagram that illustrates the weight significance for a polyphase embodiment;

DETAILED DESCRIPTION OF THE PREFERRED EMBODIMENT

Figure 18:
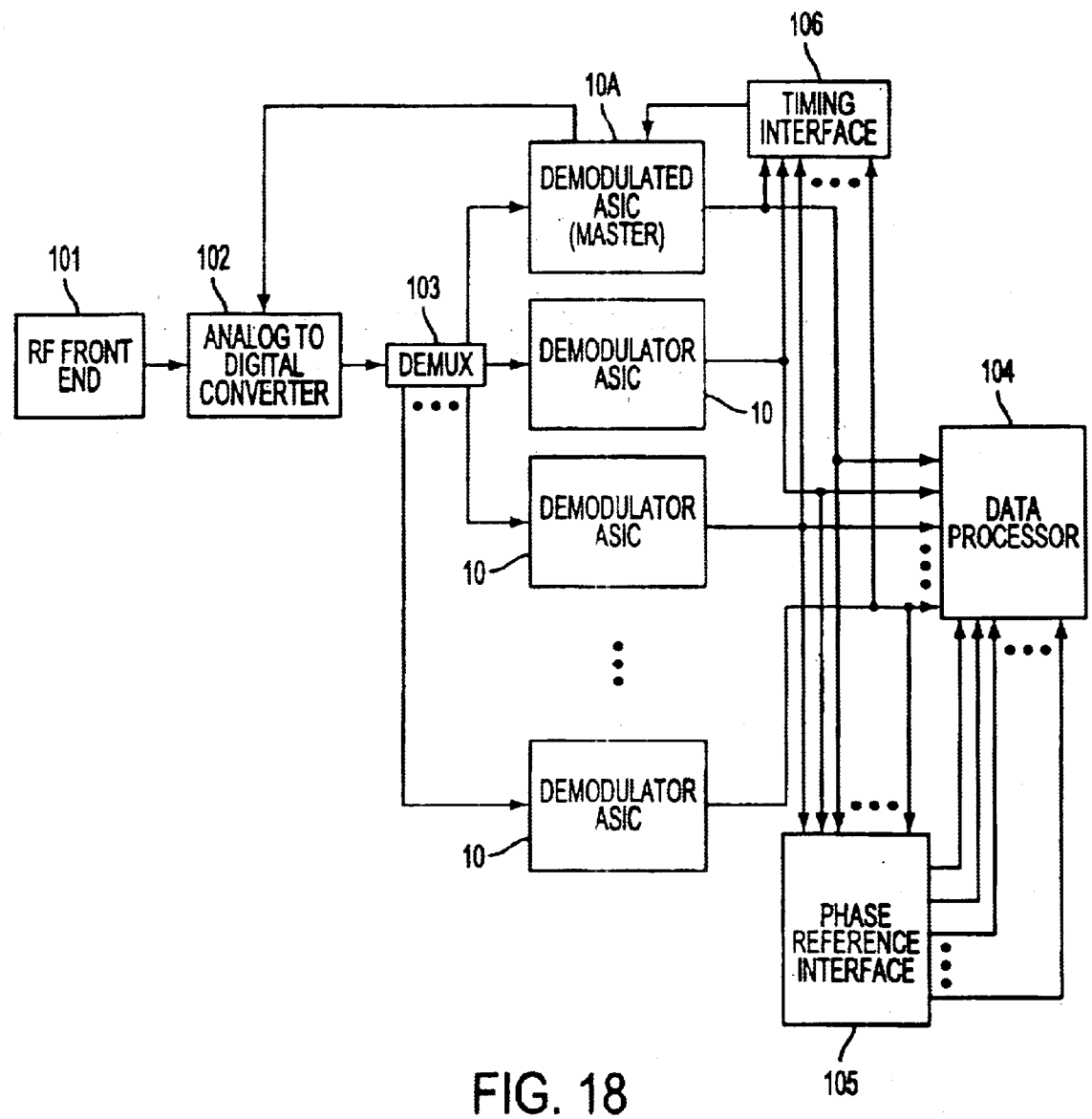
FIG. 18 is a block diagram illustrating a parallel demodulator system.

By way of introduction, in the preferred embodiment of this invention a bank or array of RADIS 10 demodulators are embodied as a parallel array of integrated circuits that are used for acquiring and demodulating radio data communications. Reference is made to FIG. 18 for illustrating a simplified diagram of a demodulator system capable of demodulating a waveform with a baud rate higher than the highest rate current technology allows an integrated circuit (IC) demodulator to be clocked. The high rate demodulation system consists of a high rate analog to digital converter 102 and demultiplexer 103, bank or array of IC demodulators 10 where one of the demodulators is designated as the master or first demodulator 10A, a phase reference interface 105, a timing interface 106, and a data processor 104.

The timing interface 106 samples one sample per demodulated symbol and is used to provide signal timing information to the first demodulator 10A. The first demodulator 10A subsequently outputs a signal timing frequency or advance/slip indication to a direct digital synthesizer or analog to digital converter (ADC) 102 shown in FIG. 18 for controlling the frequency and general timing of the ADC so as to enable the bank of parallel RADIS 10 and 10A demodulators to lock-on to and track the received signal.

The phase reference interface is used to provide phase information of the phases of the demodulated data from each demodulator 10,10A since each demodulator tracks a different phase. In other words, since the demultiplexed ADC outputs are sequentially linked to each of the demodulators 10,10a, each of the demodulators will track a different phase of the incoming signal.

The data processor 104 uses the phase information from the phase reference interface 105 to reconstruct the data sequence that existed prior to demultiplexing.

In addition, there is a Radio Frequency Front End 101 which may be conventional in construction and operation.

Figure 1A:
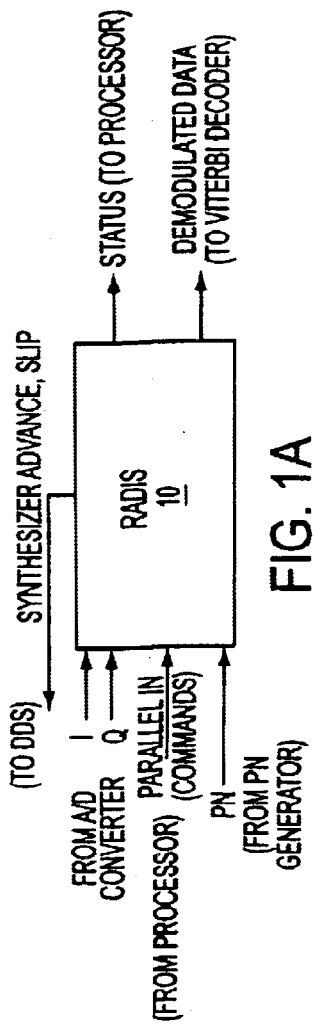
FIG. 1A is simplified diagram of a rapid acquisition dispersive channel receiver integrated circuit demodulator (hereinafter referred to as RADIS), in particular the various inputs and outputs thereof.
Figure 1B:
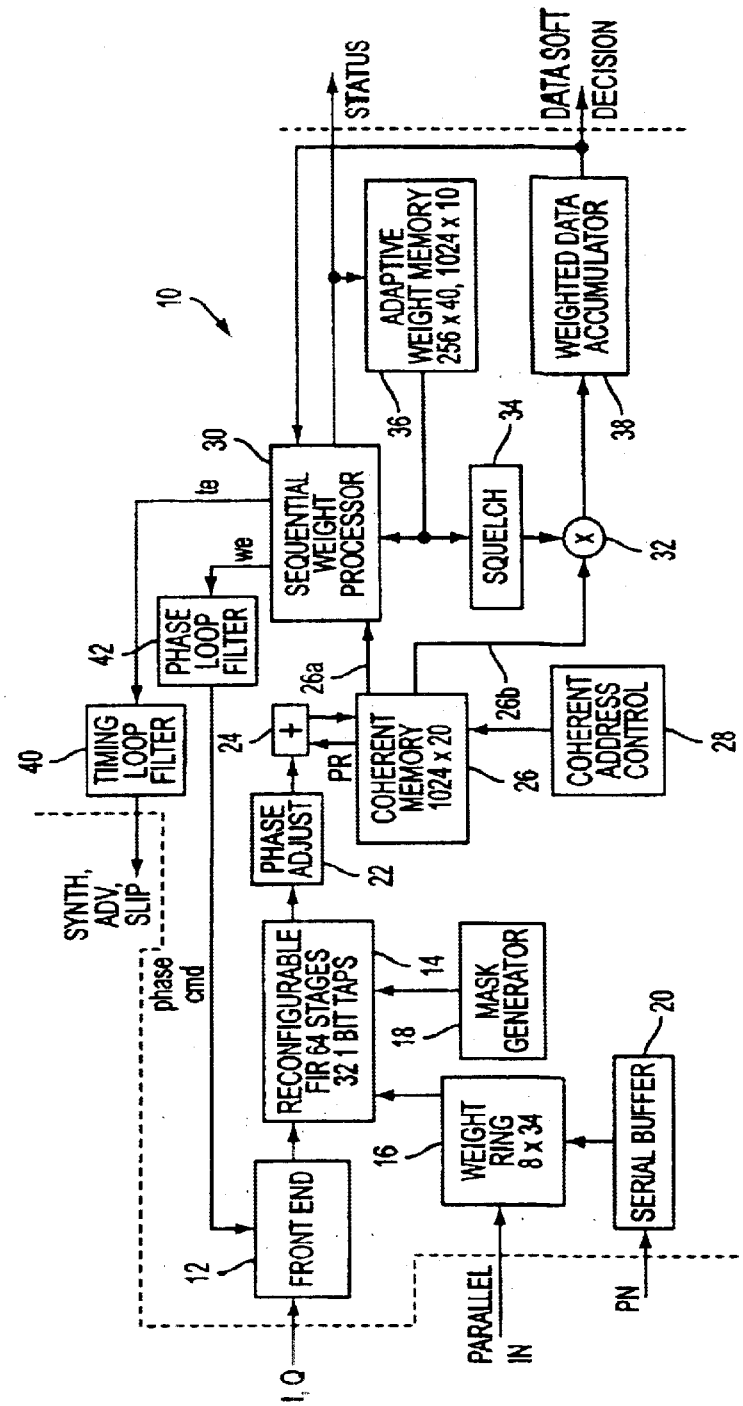
FIG. 1B is a block diagram of the RADIS demodulator of FIG. 1A.

The number of demodulators within the bank or array of IC demodulators 10,10A is selected based upon desired rate increase. With X programmable IC demodulators, a rate increase of X can be achieved. Reference is made to FIGS. 1A and 1B for illustrating a simplified diagram of a rapid acquisition dispersive channel receiver IC demodulator 10 (hereinafter referred to as RADIS 10), in particular the various inputs and outputs thereof, as well as a block diagram of the RADIS 10.

Each RADIS 10 is externally programmable with weight values for receiving and processing widely diverse waveforms. The RADIS 10 provides highly parallel time and frequency searches, it can adapt to changes in multi-path and dispersive channels, and it provides optimal demodulation under these conditions. The RADIS 10 is constructed to include a preprocessor that feeds a coherent processor which produces matched filtered symbols for storage into a multi-ported coherent memory. A multi-ported weight processor adapts weights and optimally combines components of the coherent memory to produce symbol soft decisions. The weight processor also provides error signals, time and carrier tracking output signals, and generally controls searching.

The demodulator system of parallel RADISs 10 may be used as a system in an advanced data communication system of a type that includes, but that is not limited to: spread spectrum systems, including code division multiple access (CDMA) systems; time division multiple access (TDMA) systems; systems operating under adverse channel conditions; as well as heavily filtered systems, i.e., those systems wherein the bandwidth of the channel is on the order of or less than the data rate. One example of a heavily filtered system is a telephone system wherein, by example, a 56 Kb modem operates on a conventional voice line.

By linking within each RADIS 10, the coherent processor and the weight processor components with the coherent memory, and by providing a wide configurability through a programmable input port, a high rate demodulator system is made available for various digital data reception applications. By example, the digital data could be encoded speech and/or audio data, or it could be computer network data, such as packet switched and Internet traffic, or the digital data could be facsimile data. In general, the RADIS 10 could be used to receive any type of data that one desires to transmit from a first location for reception at a second location through a radio link, or through a cable or other wiring, or through an optical fiber.

Figure 19:
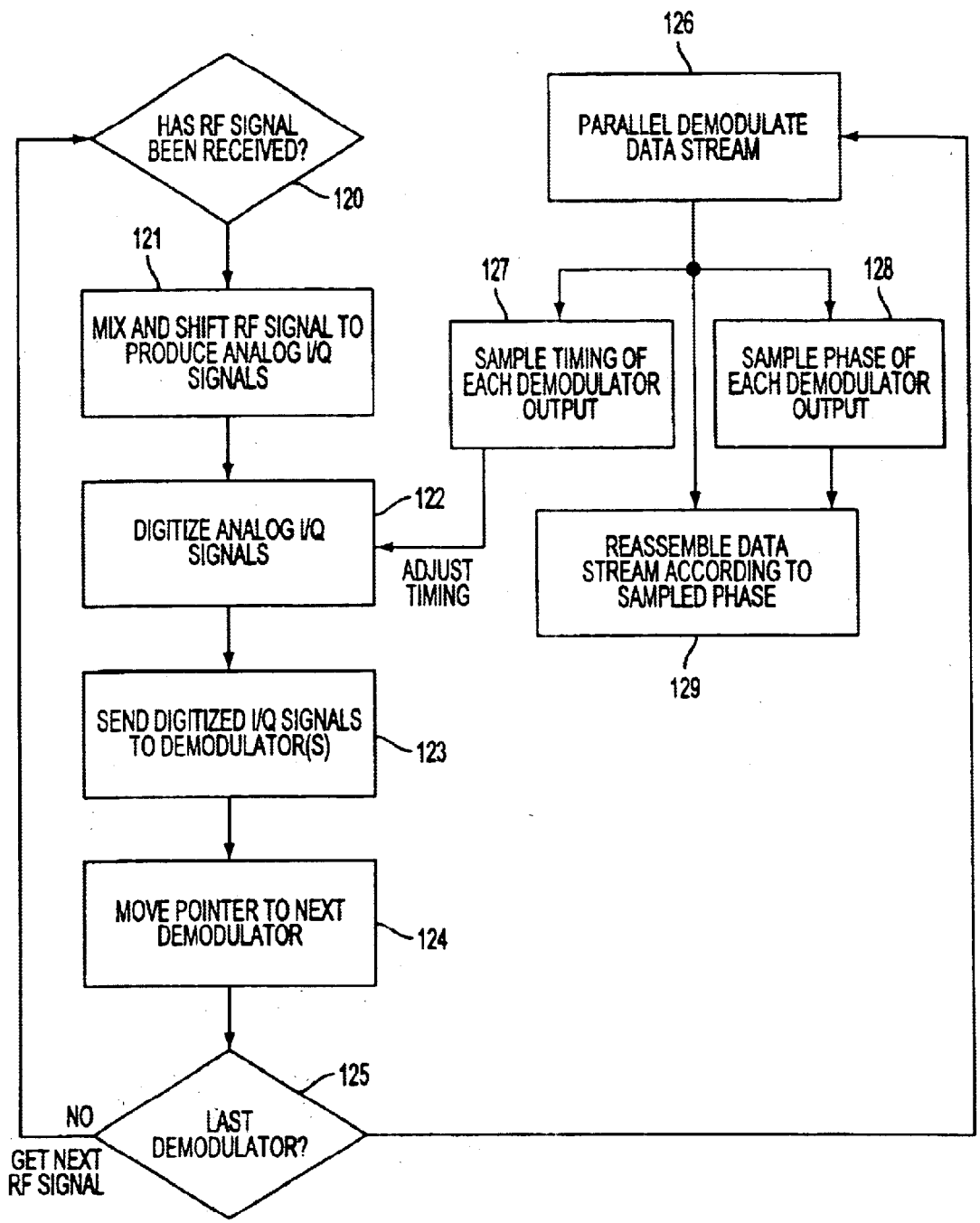
FIG. 19 is a simplified flow chart illustrating parallel demodulation.

Referring now to FIG. 19 which shows a simplified flow chart of the method of parallel demodulation of a phase modulated signal. Initially, a RF signal containing information is received 120. First the signal is mixed with another signal to produce a lower or intermediate frequency. Then the intermediate frequency is phase shifted by some amount, generally ninety degrees 121. The signals, often referred to as the I and Q signals respectively are then digitized through an analog-to-digital converter 122. Next, the I,Q signals are sent or demultiplexed to a demodulator 123. If more demodulators are available then the pointer or demultiplexer points 124 to the next one in the array. If it is not the last demodulator then another RF signal is received and the process is repeated 125. If it is the last demodulator then the data is parallel demodulated 126. The output data from the demodulator(s) is sampled both for timing 127 and phase 128. The timing samples are used to adjust timing parameters. The phase samples are used to reassemble 129 the data steam of the information as received.

In one embodiment the method can include digitizing an M number of the first analog signal and the second analog signal through an analog to digital converter (ADC) to provide an M number of the I stream digitized signals and an M number of the Q stream digitized signals. M is equal to a received symbol rate. The M number of the I stream digitized signals and the M number of the Q stream digitized signals are provided to a demultiplexer. The M number of the I stream digitized signal and the Q stream digitized signal are demultiplexed at N times the received symbol rate to provide an array of N demultiplexed outputs. N is equal to the number of the arrayed programmable demodulators. The array of N demultiplexed outputs is provided to the array of programmable demodulators.

Referring now again to FIGS. 1A and 1B, but in greater detail, each RADIS 10 is assumed to be coupled during operation to an output of a receiver's down-converter, phase detector, and analog-to-digital converter (not shown in this figure) that provide digitized In-phase and Quadrature (I/Q) signals obtained from a communication channel, such as but not limited to a radio communication channel. The RADIS 10 is also assumed to be coupled to an external controller or data processor, such as a microprocessor (not shown), and receives programming inputs therefrom (e.g., FIR weights) and outputs status signals thereto. In some embodiments a despreading code, such as a pseudonoise (PN) code from a PN code generator (not shown), is input, and the RADIS 10 is used to despread a received signal using the inputted despreading code. An output of the RADIS 10 is demodulated data (soft decision data) that is input to a suitable data decoder, such as but not limited to a well-known Viterbi decoder (not shown). Another output of the RADIS 10 is a signal timing frequency or advance/slip indication that may be provided to a direct digital synthesizer or analog to digital converter (ADC) 102 shown in FIG. 18 for controlling the frequency and general timing of the ADC so as to enable the RADIS 10 to lock-on to and track the received signal. These various external components may be conventional in construction and operation.

Each RADIS 10 includes a front end 12 that generally performs DC removal, phase shifting, accumulation and down-sampling of the input IQ signals. The output of the front end 12 is applied to a reconfigurable FIR filter 14. The FIR filter 14, in the presently preferred embodiment of this invention, has 64 stages implemented with 32 1-bit taps. A set of registers forming a weight stack or ring 16 (8×34) is connected to the parallel input port for being programmed from the external processor (not shown). The output of the weight ring 16 is a set of tap weights which are input to the reconfigurable FIR 14. A mask generator 18 also provides an output to the reconfigurable FIR filter 14. For example, the mask generator 18 may be used to set the weights for certain of the 64 FIR filter stages to zero. The weight ring 16 receives an input from a serial buffer 20, which in turn has an input connected to the PN input. The serial buffer 20 could as well be provided off-chip, and is not necessarily provided on-chip in all embodiments of the RADIS 10. The PN input, in combination with the weight ring 16 and FIR filter 14, can be used as a PN despreader at 64 half chip delays of the PN code. In this case the weight ring 16 functions as a 32-bit serial-to-parallel converter for the serially input PN code. Every 32 chips the external circuitry can shift in a new PN code set.

The output of the reconfigurable FIR filter 14 is applied to a phase adjustment block 22 and thence to a first input of an adder 24 that has a second input coupled to a first output of a coherent memory 26 (e.g., 1024×20) and an output coupled to an input of the coherent memory 26. The phase adjustment block 22 is used for frequency searching and rotates the phase of the FIR output by an appropriate amount on each clock cycle. The coherent memory 26 operates to maintain all phase information partial results from the FIR filter 14, and functions as an interface between the FIR filter 14 and a sequential weight processor 30 that is described below. The coherent memory 26 functions as a symbol matched filter at a frequency offset determined by the phase rotations applied by the phase adjustment block 22 (and can be used in the PN search mode case as well).

The multi-ported coherent memory 26 has a single input (from the adder 24) and three outputs. The adder 24 receives a partial result (PR) from the first output of the coherent memory 26, adds the output of the FIR filter 14, via the phase adjuster 22, and stores the result back into the coherent memory 26. The addressing of the coherent memory 26 is controlled by a coherent memory address control block 28. The coherent memory 26 provides a second output to a sequential weight processor 30 and a third output to a first input of a multiplier 32. A second input to the multiplier 32 is provided from the output of a squelch block 34. The squelch block 34 operates to set to zero those weights that are below a predetermined level, and to pass the rest unchanged. The output of the multiplier 32 is provided to an input of a one symbol weighted data accumulator 38 which provides data soft decisions to the data processor 104.

The sequential weight processor 30 functions to adjust the adaptive weight memory in all modes. In essence, the sequential weight processor 30 operates to sequentially adjust weights that are used, for a second FIR example, to enhance multi-path operation. The sequential weight processor 30 and the squelch block 34 both receive an input from an adaptive weight memory 36 (256×40, 1024×10). The adaptive weight memory 36 may be considered to produce the weights and to perform sequentially what the first FIR filter 14 does in parallel. The weights that are output from the sequential weight processor 30 are provided as a status signal output of the RADIS 10. The sequential weight processor 30 also provides error outputs to a timing loop filter 40 and a phase loop filter 42. The timing loop filter 40 provides the RADIS 10 synthesizer frequency or advance and slip output signals, while the phase loop filter 42 provides a phase command signal that is fed back to the front end 12 to maintain carrier phase or frequency lock with the input IQ signals.

The FIR filter 14, the weight ring 16, the mask generator 18 and the coherent address control 28 are all configured to produce a symbol matched filter with successive delays in successive slots of the coherent memory 26. The same data can be filtered with multiple time invariant matched filters, or possibly with different center frequencies in the over sampled cases, and each output will occupy successive blocks of the coherent memory 26. The same process occurring on successive data symbols fills successive addresses in the coherent memory 26, eventually wrapping around to the first address. The coherent memory data is thus available until overwritten by later data on the next wrap.

Figure 2A:
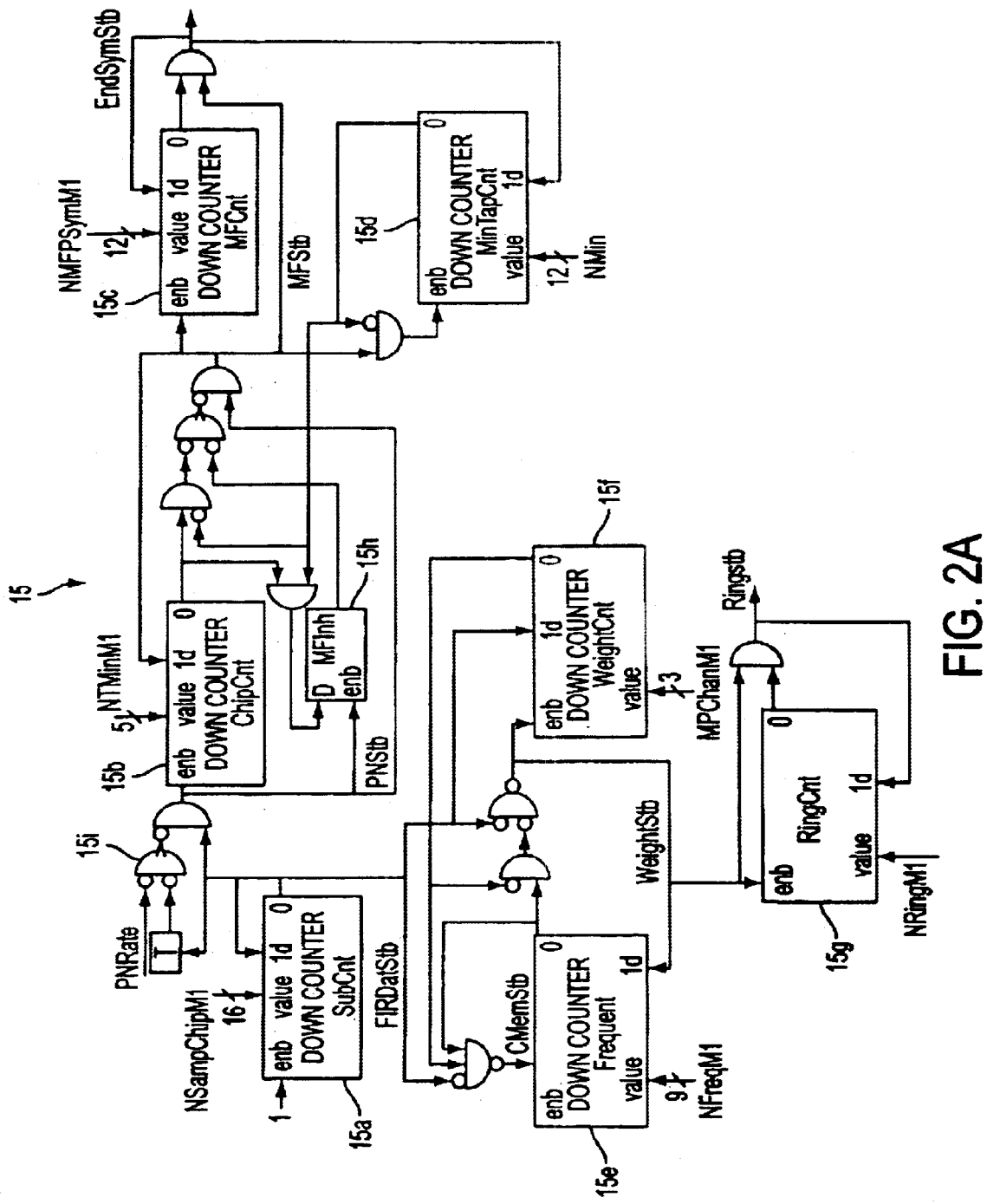
FIG. 2A is a block diagram of a coherent processor strobe generator that forms a part of the RADIS of FIG. 1B.
Figure 2B:
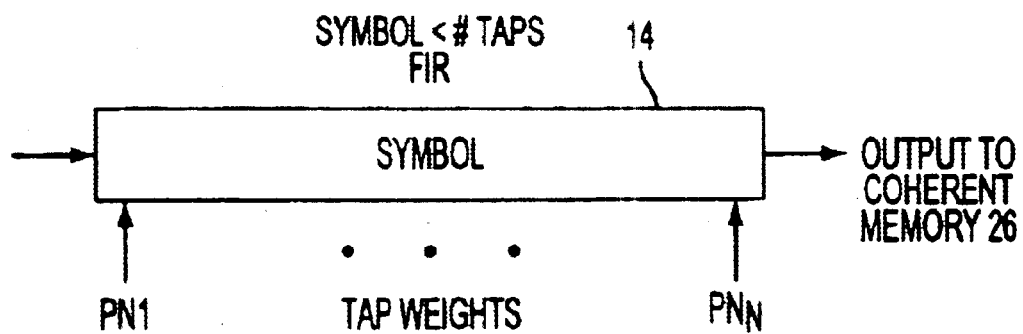
FIGS. 2B–2C depict two exemplary uses of the FIR as a correlator.
Figure 2C:
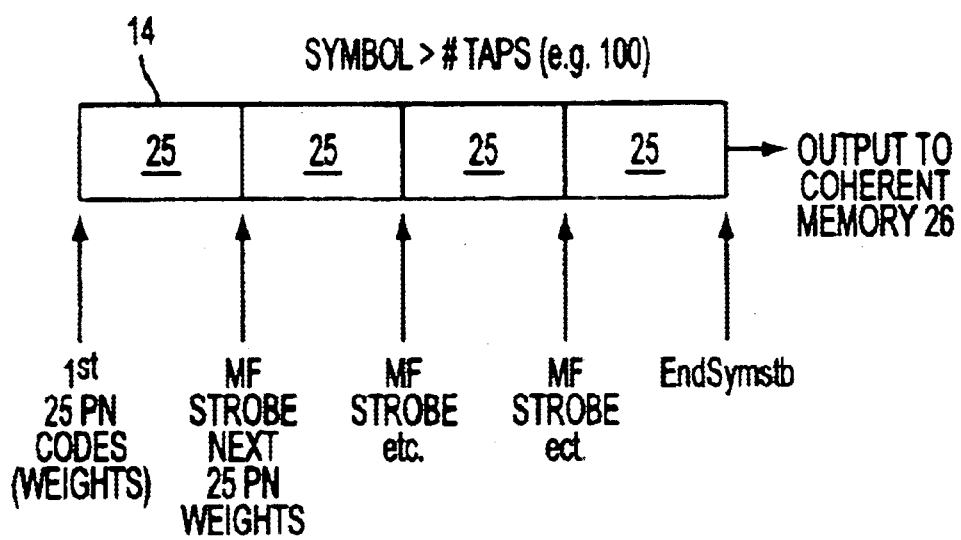

Reference is now made to FIG. 2A for illustrating an embodiment of a coherent processor strobe generator 15 that operates in conjunction with the FIR filter 14 of FIG. 1B. A purpose of the strobe generator 15 is to place the matched filter outputs into the coherent memory 26. The strobe generator 15 has a number of programming inputs, described below, and an output EndSymStb (End Symbol Strobe) to indicate the end of a symbol. The strobe generator 15 operates the FIR filter 14, at any given time, in one of two basic modes. The two basic modes are a fixed tap FIR filter mode and a parallel correlator mode. In the parallel correlator mode the FIR filter 14 is operated as a parallel correlator (e.g., as a PN code correlator). In a simplest configuration for this mode depicted in FIG. 2B, the number of filter taps is greater than the number of chips in a symbol. Each output of the FIR filter 14 during a symbol time corresponds to an increment in signal delay, and the outputs are stored into the coherent memory 26. In a more complex mode, depicted in FIG. 2C, the number of taps is less than the number of chips in a symbol (e.g., 100 chips per symbol). In this case the symbol is divided into a plurality of sub-symbols (e.g., four, 25 chip sub-symbols). The first 25 PN codes or weights are then applied via the weight ring 16 to the first 25 chips of the symbol, and the resulting outputs are stored into the coherent memory 26. A matched filter strobe (MF Strobe) signal is then generated to strobe in the next 25 PN weights to the weight ring 16, and the 25 outputs of the matched filter 14 are added to the first 25 weights (using adder 25) and the 25 partial results are stored back into the coherent memory 26. This process is repeated for the next 25 sub-symbol chips, and then the next 25 sub-symbol chips. At the end of the 100 chip symbol the signal End Symbol Strobe (EndSymStb) is generated by the strobe generator 15 of FIG. 2A, and the contents of the coherent memory 26 represent a symbol matched filter output with 25 delays.

If the number of the PN code were instead 97, then the partitioning of the filter would be n, n, n and n+1, where n=24. If the number of the PN code were instead 98, then the partitioning of the filter would be n, n, n+1 and n+1, where n=24. It is preferred to make each partition as large as possible. As such, if the number of the PN code was 96, then the filter 14 would preferably be partitioned as three, 32 tap filters. In any of these cases the weight ring or stack 16 basically functions as a register to present the PN code to the FIR filter 14.

Figure 3A:
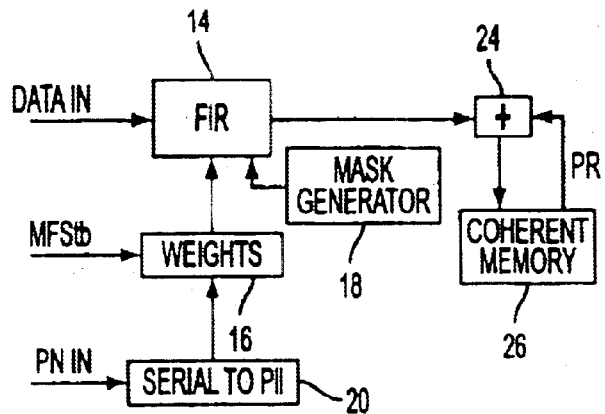
FIG. 3A is a block diagram of a symbol time PN matched filter using the Finite Impulse Response (FIR) block of FIG. 1B.
Figure 3B:
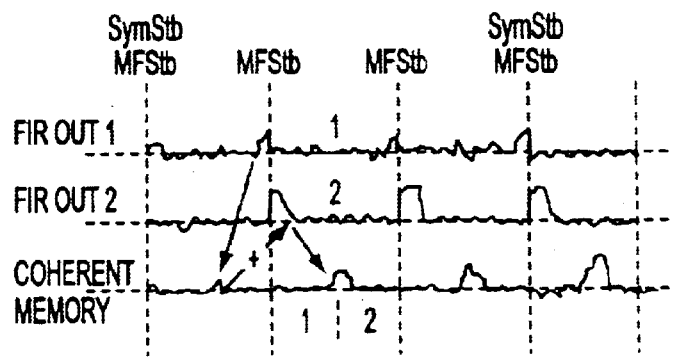
FIG. 3B is the corresponding waveform diagram for the symbol time PN matched filter embodiment of FIG. 3A.
Figure 4:
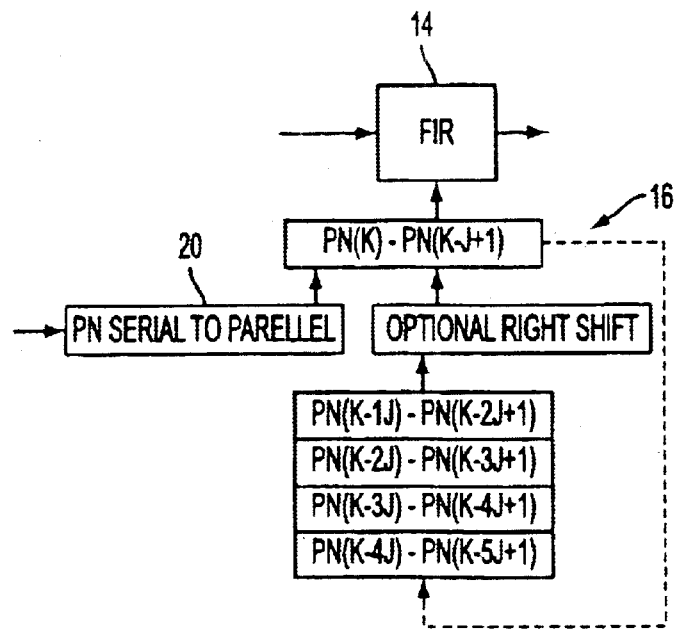
FIG. 4 depicts an example of over sampled dynamic weighting with delayed codes when using the FIR block of FIG. 1B.

Reference with regard to the foregoing can also be had to FIGS. 3A, 3B and 4, wherein FIG. 3A is a block diagram of the symbol time PN matched filter using the FIR filter 14, and FIG. 3B is an exemplary corresponding waveform diagram for the symbol time PN matched filter embodiment of FIG. 3A, wherein there are two weights per chip (i.e., two times oversampling to double the number of delays covered), and three matched filter cycles per symbol. The arrows and + sign indicate the operation of the adder 24 in adding the content of the coherent memory 26, representing the first FIR output, to the second FIR output, and the subsequent storage of the sum back into the coherent memory 26. It should be noted that the matched filter strobe (MFStb) delays can vary by one chip time to accommodate arbitrary processing gains (number of chips per symbol), providing the (n, n+1) mode referred to above.

The matched filter (MF) time is the time between matched filter updates in the parallel correlator mode. This time takes on two values during a symbol. The first Nmin are of length NTMin and the rest of the NMFPSym are of length NTMin+1 PN chip times. This allows an integer number of matched filter updates per symbol time, with an arbitrary number of PN chips per symbol.

The number of delays processed can be increased from NTMin, if multiple clocks per FIR input exist, by using the weight ring 16. After a weight ring update the weight ring 16 contains a stack with the newest weight on the top and successively older weights below. On each clock the weights rotate upward presenting older and older weights to the FIR filter 14 allowing the current FIR input register to correlate with larger delays of PN. When the weight ring 16 is updated, the oldest weight is replaced by the newest. The most recent PN in each of the weights is maintained. This requires that when a long MF time occurs the old weights in the weight ring 16 be shifted to continue to match the input data to the FIR filter 14. The newest PN of a weight becomes the NTMin+1 old Pn of the successive (higher on stack) weight.

In the MF interval following a long MFtime, the size of the FIR filter 14 is increased by one to match the extra PN produced. An Extra Tap operation causes this to occur by increasing the end of the mask in the mask generator 18 by one. Note that the actual FIR length must be at least NtMin+1. In fact, and due to symbol framing considerations discussed next, the FIR may need to be a few chips larger yet.

The above technique maintains the weights in the weight ring 16 synchronous with the FIR data, with delays increasing by NTMin for each ring shift. The first PN and final PN of a symbol however become shifted with respect to the most recent PN of a given weight. The Maskend must then be moved on the first FIR time of a symbol and the MaskStart on the final FIR time in order to properly frame the symbol. When the FIR filter 14 is loaded with the final weight for a symbol, the latest PN (start position) corresponds to the last PN of the symbol. As subsequent long MF time updates are made, this start position is shifted, and MaskStart is incremented to accommodate this. Similarly, when the FIR filter 14 is loaded with the first weight of a symbol the first PN of the symbol is at position NTMin. This PN also is shifted on long MF times and Mask End is compensated for this shift.

The amount of the start and end shifting is computed on each clock. For the first weight in the weight ring 16 it is zero. On subsequent weights it is the number of long MF times that occurred to arrive at that weights' position in the weight ring 16.

FIG. 4 depicts an example of over sampled dynamic weighting with delayed codes to extend the number of delays processed when using the FIR filter 14. In FIG. 4 the weight stack 16 is rotated using sub-chip strobes through one complete cycle, and the FIR filter 14 output is directed to the proper coherent memory 26 address. The weight stack 16 is of variable length, up to eight in the presently preferred embodiment. On the occurrence of the MFStrobe signal the shift is inhibited and a new PN code segment is loaded from the register (serial buffer 20). Subsequent codes can be optionally right shifted to compensate for long intervals, i.e., to prevent the data from getting ahead when operating in the n, n+1 mode. The shift can be by two when operating with two samples per chip (i.e., two times over sampling). In FIG. 4 the variable J is equal to the effective length of the FIR filter 14.

As an example of the operation of the RADIS 10: for QPSK spreading each weight is represented by two consecutive bits in the weight ring 16. Mask generator 18 Mask Start and Mask End values are calculate in terms of chips and applied to QPSK spreading. Mask Start is multiplied by 2 to apply to QPSK spreading, and Mask End is multiplied by 2, and 1 is then added to apply to QPSK spreading. As an example, if Mask Start=1 and Mask End=14 are computed for binary spreading, then Mask Start=2 and Mask End=29 for QPSK spreading.

Referring again to FIG. 2A, the strobe generator 15 is comprised of a plurality of counters 15a–15g, a flip/flop 15h, and various combinatorial logic elements, including logic 15i that divides its input signal by two when using two times over sampling (i.e., two samples per chip). In general, the down counter 15b is loaded with the number of taps for the matched filter, the down-counter 15c is loaded with the number of matched filters per symbol, the down counter 15d is used in the n, n+1 mode (e.g., 24 taps, 25 taps), the internal WeightStb signal updates the weights, the Ringstb output is used to rotate the weight ring, CMemStb is an internal signal indicating that it is time to write to the coherent memory 26, and the flip/flop 15h is employed to inhibit the generation of the MF strobe signal for one clock time when operating in the n, n+1 mode.

The strobe generator 15 is responsive to the following input configuration command parameters. Note should be made that a Chip or PN in this context refers to an accumulated sample, and would typically be half a PN clock time.

| | |
|---|---|
| NMFPSymM1 | Total Number of matched filter correlations in a Symbol - 1 (0–4191) |
| Nmin | Number of matched filter correlations with smaller tap size (1–4191) |
| NTMinM1 | The smaller matched filter size - 1 (0–31) |
| NSampChipM1 | Number of samples per chip -1 (0 to 65535) |
| NpchanM1 | Number of delays multiplication factor -1 used when oversampling (0 to 7) |
| NFreqM1 | Number of frequency bins -1 to sequentially search (0 to 511) |
| NsymA | (NTminM1+1) * (NpchanM1+1) number of addresses per symbol |
| Nsrchsymm22 | less than Number of non-coherent symbols in acquisition (acq) |
| NringM1 | Number of Active weights in ring -1 >NPchanM1 for polyphase |
| acq | 1=acq mode |
| srchcmd | set to start search, zeroed by system on search complete |
| PNRate | 1=FIR samples at PN clock rate, 0=FIR samples at twice PN rate |

Figure 5:
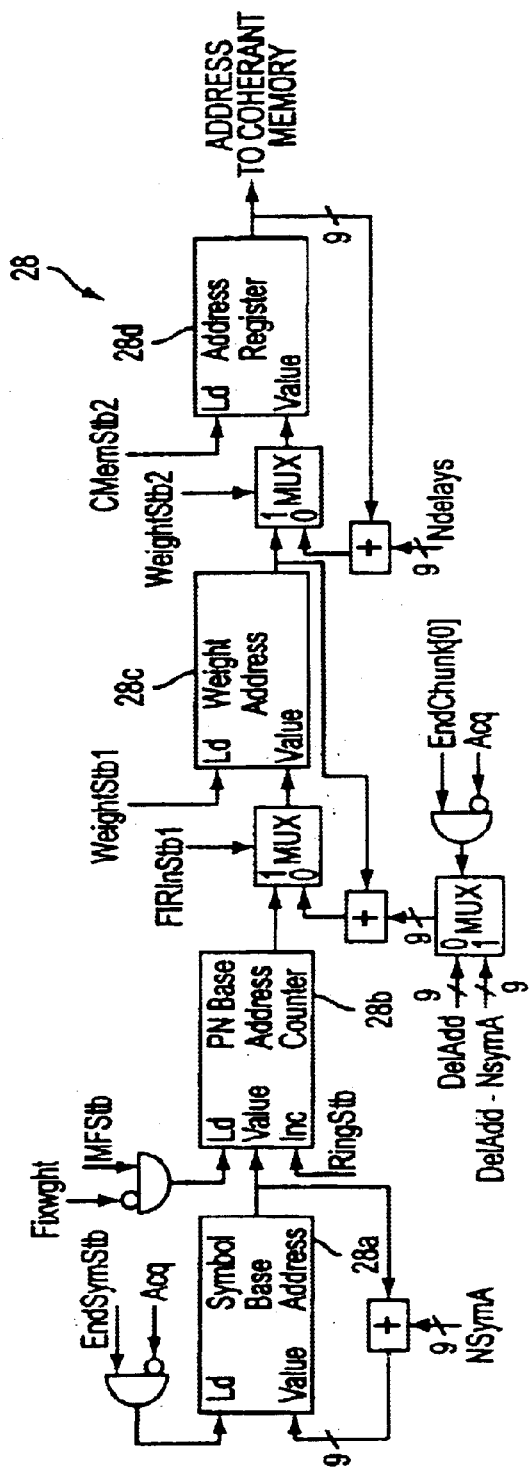
FIG. 5 is a block diagram of the coherent memory address control block of FIG. 1B.
Figure 6:
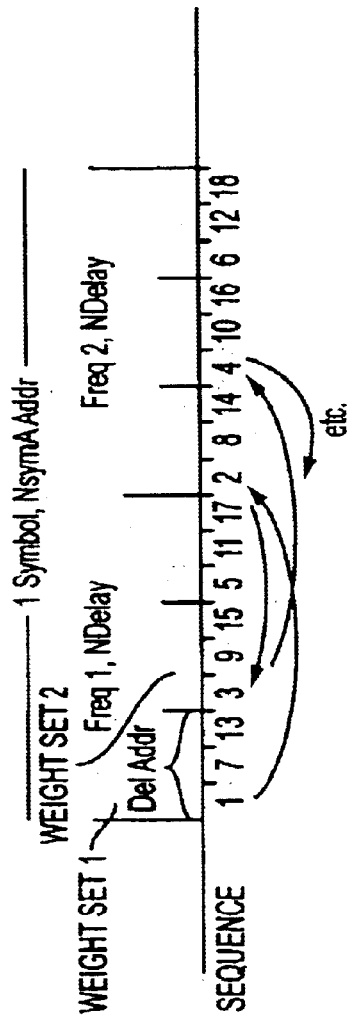
FIG. 6 is an exemplary memory map of the coherent memory.

FIG. 5 is a block diagram of the coherent memory address control 28 of FIG. 1B, while FIG. 6 is an exemplary map of the coherent memory 26. In FIG. 5 the coherent memory address control 28 can be seen to include a plurality of registers and counters 28a–28d, as well as adders and multiplexers. NSymA is a parameter that represents the number of symbol addresses, that is, the total address block size for one symbol (typically less than 1024 to prevent overwriting). The parameter DelAdd (Delay Add) represents the number of addresses within a single matched filter. Referring to the n, n+1 mode example given above, DelAdd would be equal to 24 for the 24, 25 case. Ndelays is a command parameter that indicates a total number of delays associated with a symbol. The signal Acq indicates that the FIR filter 14 is being operated in the acquisition mode. In this mode each symbol overwrites the previous one and is immediately sent to the weight processor. The signals EndSymStb and RingStb are produced by the coherent processor strobe generator 15 as shown in FIG. 2A, and the signal Fixwght is used to indicate that the FIR filter 14 is being used as a tapped delay line with fixed weights, not as a despreader or correlator.

FIG. 6 gives an example of the operation of the coherent memory address control 28 for a case where Ndelay=9, NSymA=18, DelAdd=3 and NFreq=2. This implies that one is looking at nine delays at each of two frequencies. It is also assumed for this example that there are six clocks per PN symbol. FIG. 6 illustrates the sequence in which a contiguous portion of coherent memory, representing one symbol, is written.

Figure 7:
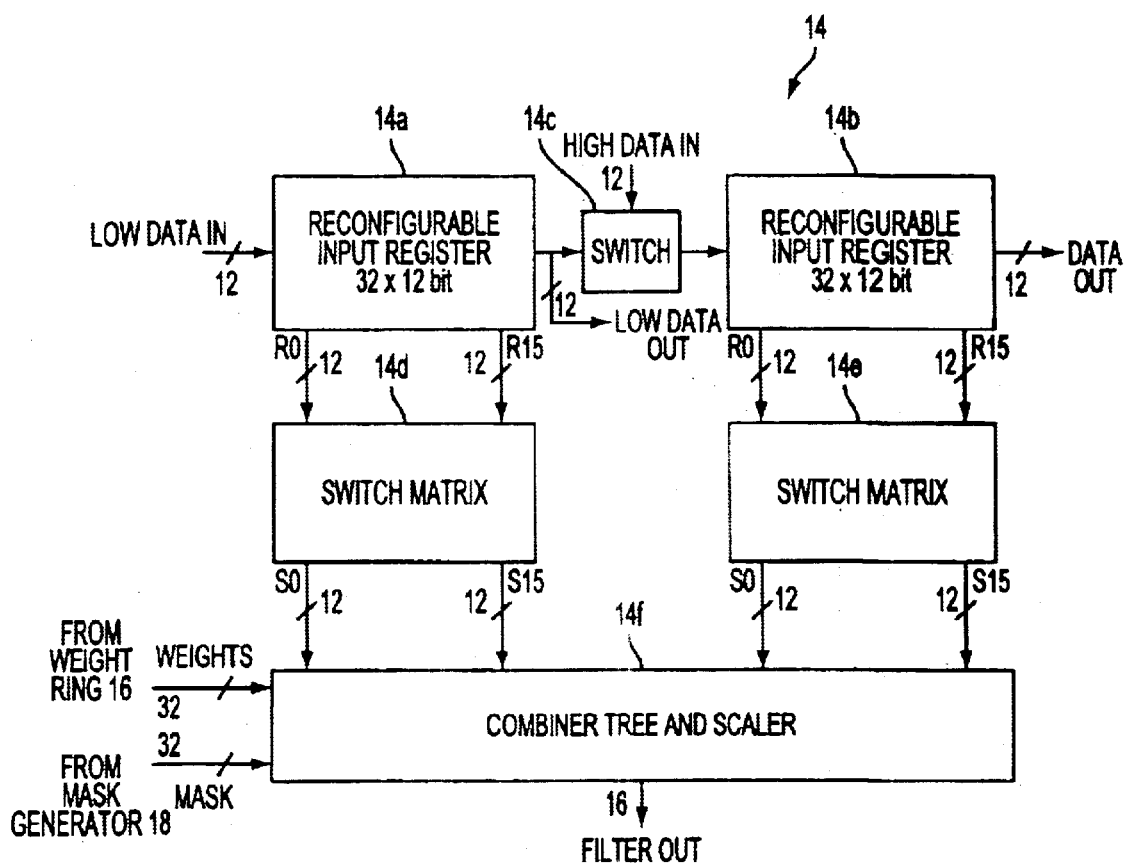
FIG. 7 is a block diagram of the programmable (reconfigurable) FIR filter of FIG. 1B.

Reference is now made to FIG. 7 for illustrating a block diagram of the FIR filter 14. In general, the FIR filter 14 is a reconfigurable digital FIR having a fixed number of input bits representing a complex number. The FIR filter 14 can be configured to have one, two, four or eight real or complex weight bits, where filter sections are combined to trade filter length vs. input bits. A programmable number of delays between taps enables polyphase and various extended configurations. The filter length and zero weights are controlled by the external mask generator 18 (FIG. 1B). The number representation (biased twos complement) makes efficient use of the hardware.

As a quick review, the binary digits 101=5.5 in biased twos complement, 0000=0.5, and 1111=−0.5. A mask bit from the mask generator 18 forces a zero when needed. An advantage of the use of biased twos complement is that all multipliers can be XOR functions, and bit inversion does not require the use of carries.

In FIG. 7 the FIR filter 14 can be seen to contain two reconfigurable 64×12 bit input registers 14a and 14b, a switch 14c, two switch matrixes 14d and 14e, and a combiner tree and scaler block 14f. The 12-bit input (low data in) is typically encoded as 6 bits of I and 6 bits of Q data. The (optional) switch 14c enables six most significant bits (MSBs) to be entered into the input register 14b, while the six least significant bits (LSBs) are entered into the input register 14a. The input registers 14a, 14b are shown in greater detail in FIGS. 8A and 8B, the switch matrixes 14c, 14d are shown in greater detail in FIG. 10, and the combiner tree and scaler 14f is shown in greater detail in FIG. 12.

In general, this FIR filter embodiment enables six real and six imaginary, or 12 real and 12 imaginary, input bits to be used in combination with 32 binary real weights, or 1, 2, 4 or 8 bit real or complex weights. A 64 stage alternate zero mode, for half chip rate sampling, is provided, as is a 32-bit zero weight mask. The FIR filter 14 is cascadable, provides a scaled output, and is polyphase compatible.

Figure 8A:
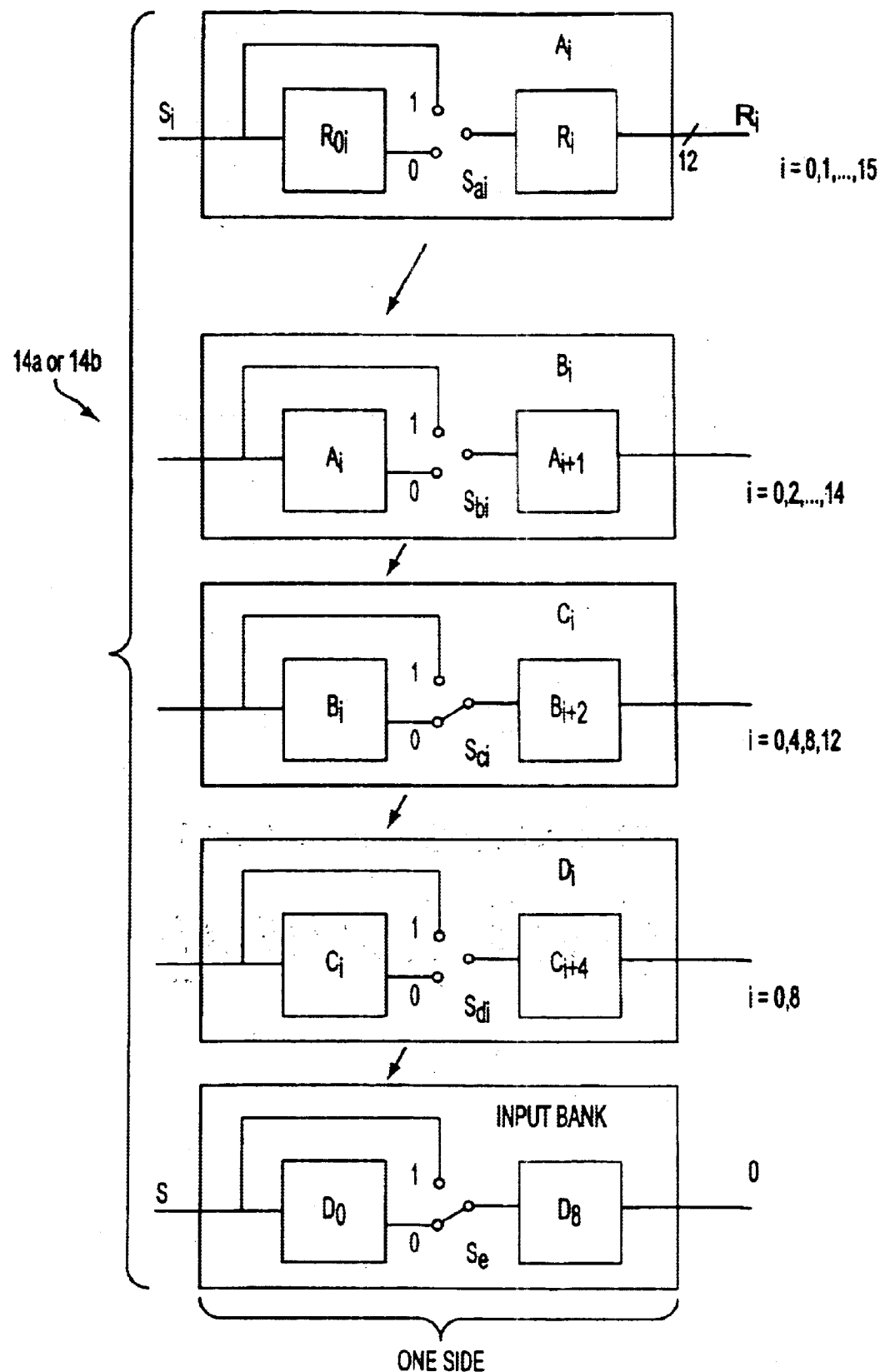
FIG. 8A depicts the FIR input register organization.

Referring to FIG. 8A, the $R_{oi}$ and $R_i$ blocks each represent one of the 64, 12-bit input data registers. The 6 bits of I data and 6 bits or Q data is applied on the $S_i$ line and is applied to $R_{oi}$ and selectively to $R_i$, depending on the state of switch $S_{ai}$. The remaining configurations (e.g., $A_i$, $A_{i+1}$) show how the registers are built from lower assemblies, A from R, B from A, C from B, and D from C, where i designates the weight tap location.

Figure 8B:
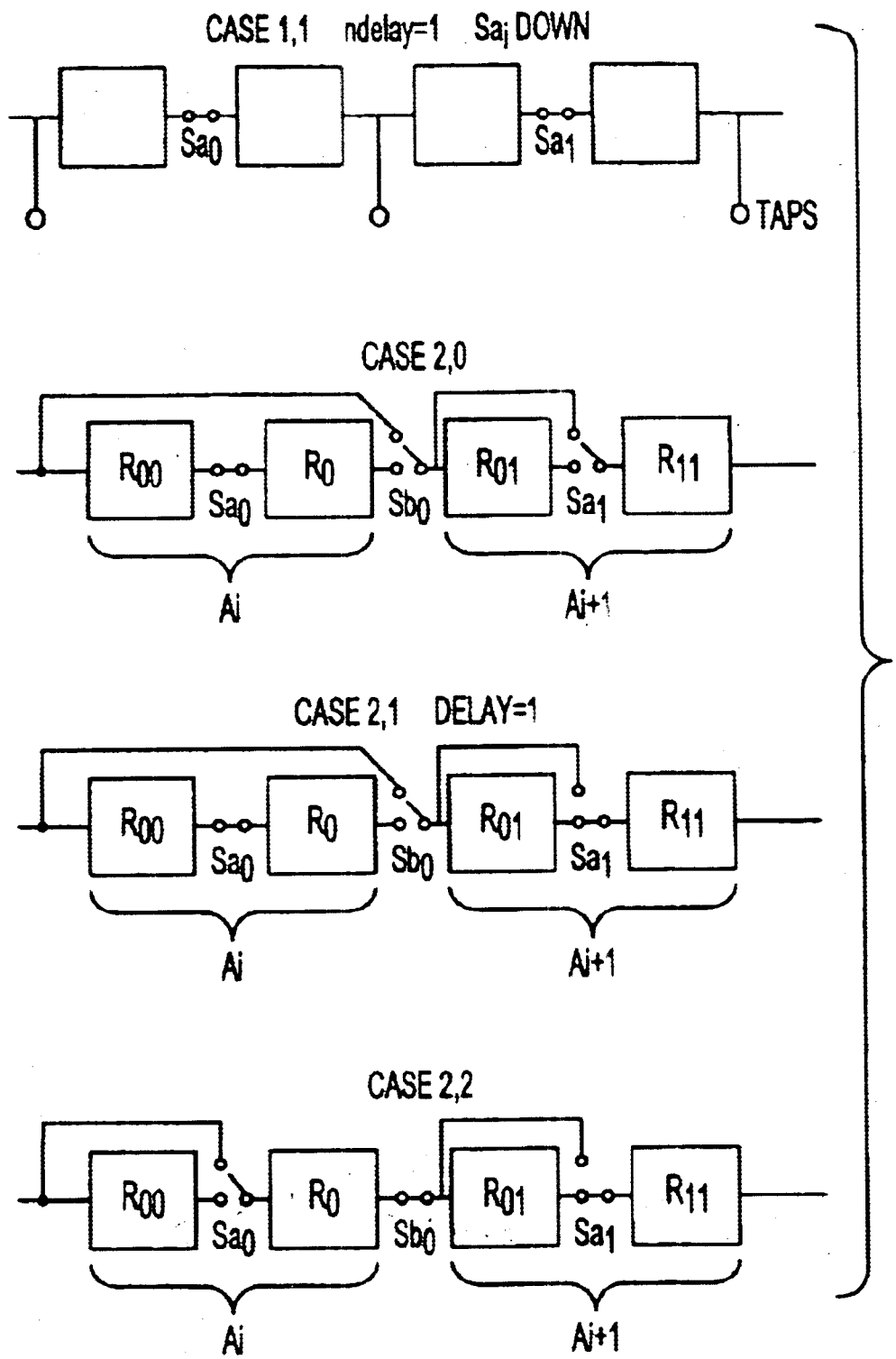
FIG. 8B depicts various examples of input register configurations.

FIG. 8B illustrates four exemplary cases (1,1 2,0 2,1 and 2,2) that are useful in understanding the various input register configurations listed in FIG. 9. Note that, for example, case 2,0 refers to delta taps=2 and N delay=0, case 2,1 refers to delta taps=2 and N delay=1, and case 2,2 refers to delta taps=2 and N delay=2.

Figure 10:
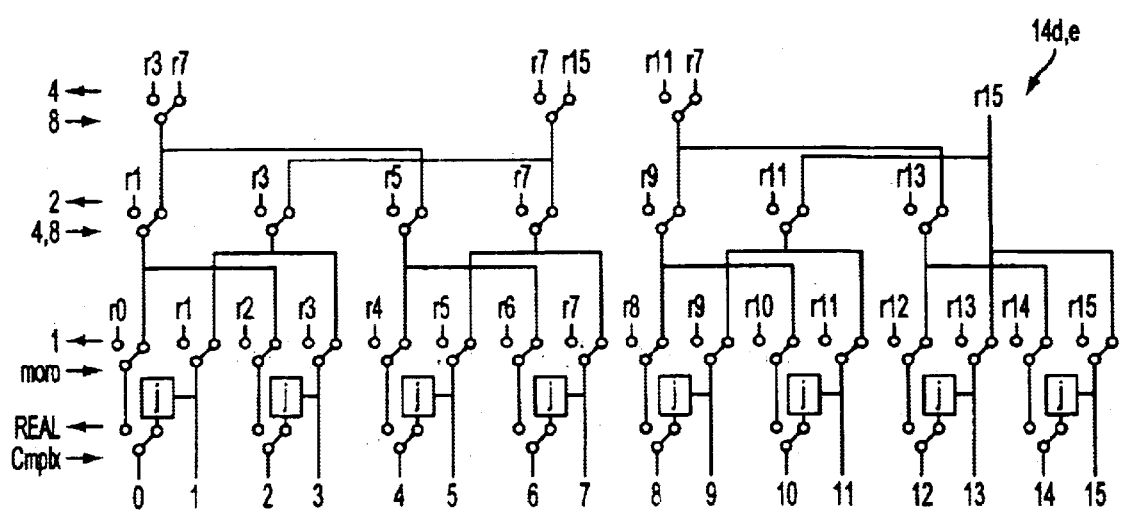
FIG. 10 is a schematic diagram of a FIR filter switch matrix.

FIG. 10 depicts one switch matrix (either 14d or 14e), and is intended to be read in combination with FIG. 9 for showing the switch states for various modes of Real (R) and Complex (C) operation. The following Table illustrates the various modes of operation as they pertain to the combiner tree and scaler 14f. FIG. 11 shows the corresponding FIR register to combiner tree switching.

Combiner Tree Input Scaling

| Mode/<br>Inputs | 0–1 | 2–3 | 4–5 | 6–7 | 8–9 | 10–11 | 12–13 | 14–15 |
|---|---|---|---|---|---|---|---|---|
| 1R | ×1 | ×1 | ×1 | ×1 | ×1 | ×1 | ×1 | ×1 |
| 1C | ×1 | ×1 | ×1 | ×1 | ×1 | ×1 | ×1 | ×1 |
| 2R | ×1 | ×2 | ×1 | ×2 | ×1 | ×2 | ×1 | ×2 |
| 2C | ×1 | ×2 | ×1 | ×2 | ×1 | ×2 | ×1 | ×2 |
| 4R | ×1 | ×2 | ×4 | ×8 | ×1 | ×2 | ×4 | ×8 |
| 4C | ×1 | ×2 | ×4 | ×8 | ×1 | ×2 | ×4 | ×8 |
| 8R | ×1 | ×2 | ×4 | ×8 | ×16 | ×32 | ×64 | ×128 |
| 8C | ×1 | ×2 | ×4 | ×8 | ×16 | ×32 | ×64 | ×128 |

In FIG. 10 the blocks designated with a "j" indicate a complex multiply, which basically swaps I and Q and inverts Q (same as a 90° multiply).

FIG. 11 shows the inputs to the combiner tree 14f. By example, 1R represents one real bit, 1C represents one complex bit, or ±1, ±j if quadraphase spreading is being used.

Figure 12:
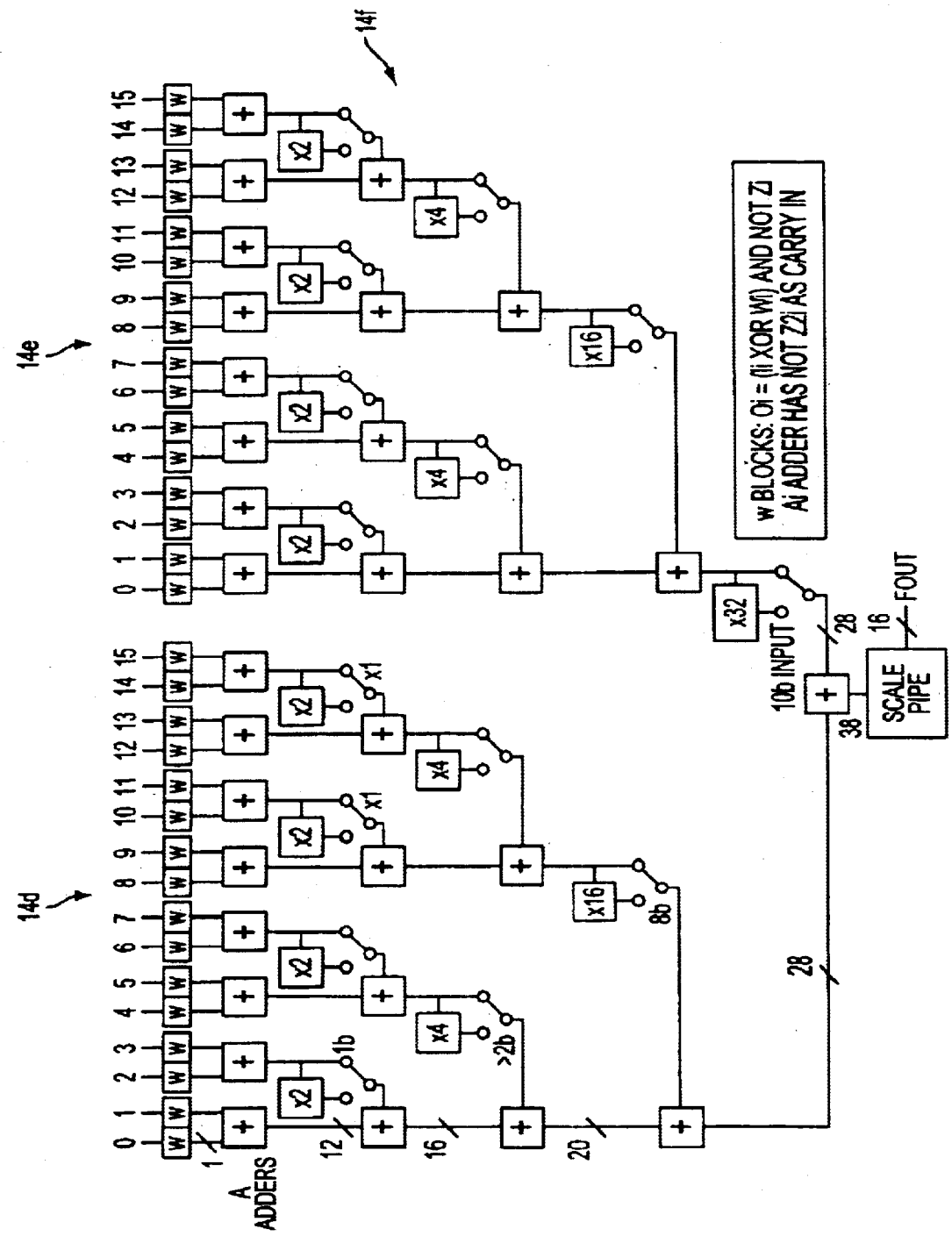
FIG. 12 is a block diagram of a FIR filter combiner tree having inputs connected to the outputs of the FIR filter switch matrix of FIG. 10.
Figures 13A, 13B:
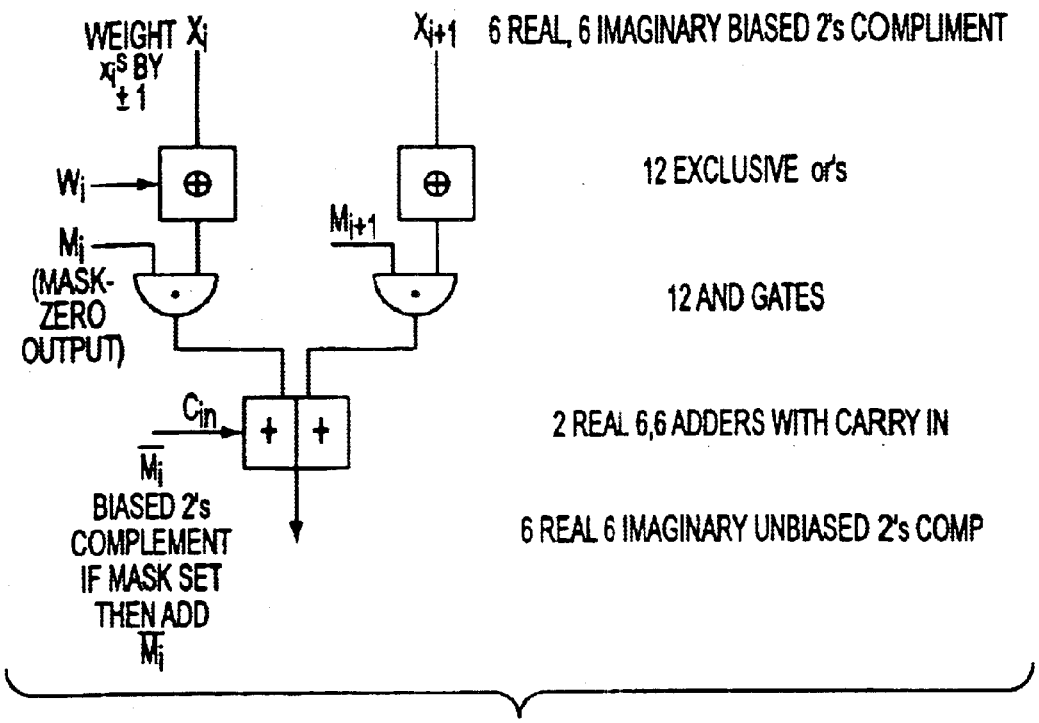
FIG. 13A depicts the weighter and first adder of FIG. 12 in greater detail.
FIG. 13B is a representation of a 4-bit weight.
Figure 14:
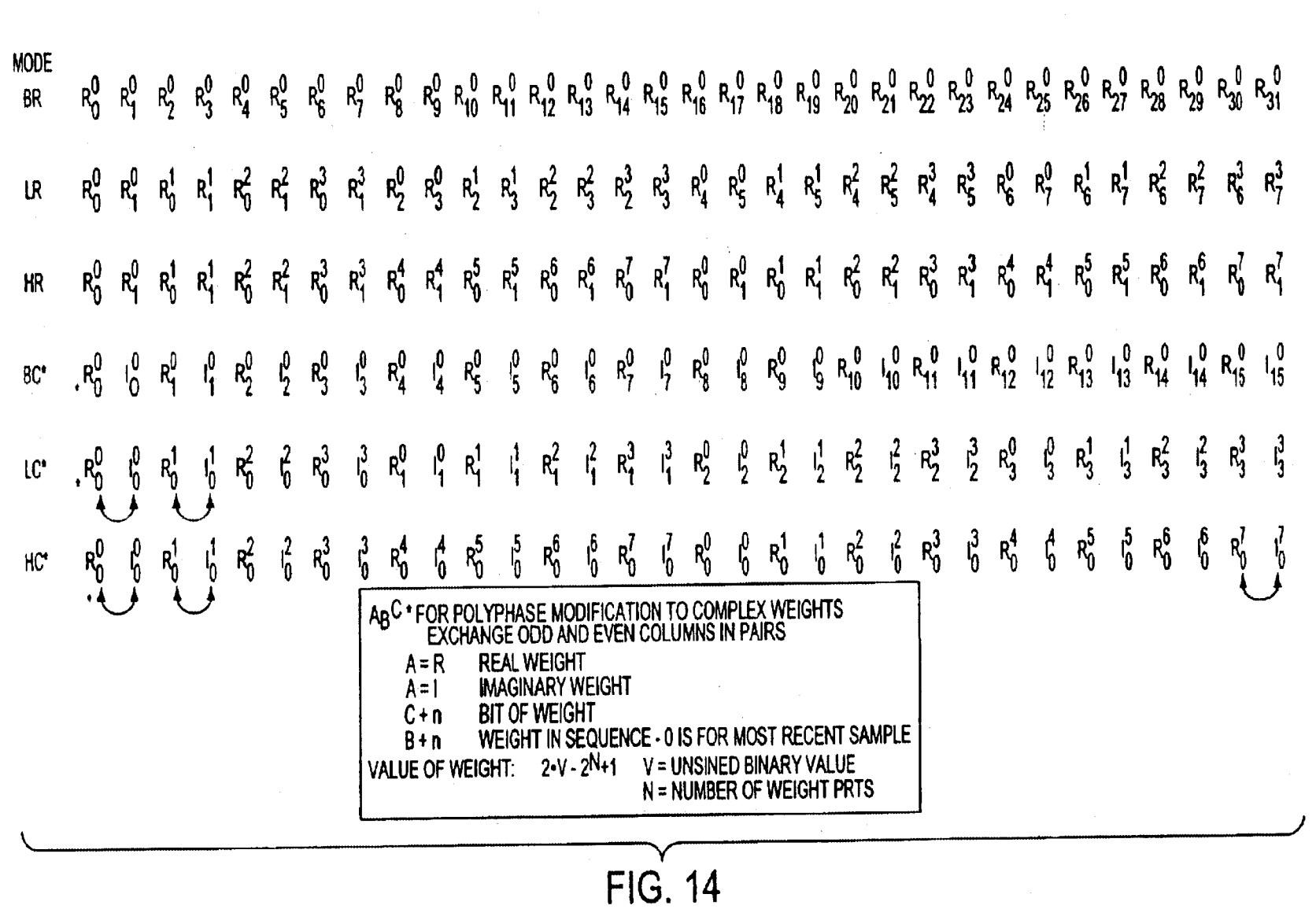

FIGS. 12 and 13A, 13B should be viewed together, as FIG. 13A shows the weight (W) and first adder (A) detail of FIG. 12, while FIG. 13B depicts various 4-bit weight representations. FIG. 14 shows the weight significance for each bit of a weight word. In FIG. 14 BR represents Binary Real (1 bit), LR represents Low Real (4 bits), HR represents High Real (8 bits), BC represents Binary Complex, LC represents Low Complex, and HC represents High Complex. Two bit weights are not shown. $R^{ij}$ represents the $j^{th}$ bit of the real part of the $i^{th}$ weight.

In general, the reconfigurable FIR filter block 14 provides a significant amount of flexibility, and enables a user to programmably trade-off the length of the FIR versus the weight resolution. The output is comprised of samples of the input data stream (contiguous or delayed (polyphase)), that are weighted and added together.

Figure 13C:
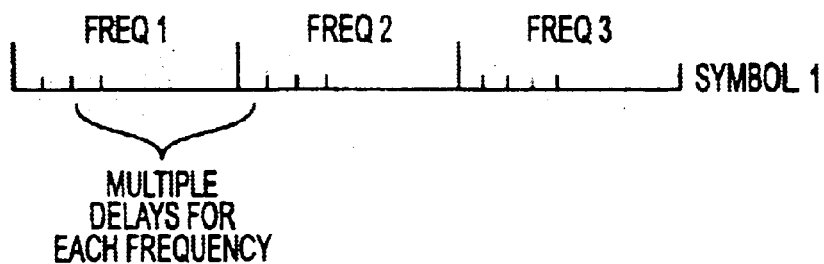
FIG. 13C illustrates an exemplary symbol that is transmitted with three different frequencies with multiple delays for each frequency.
Figure 13D:
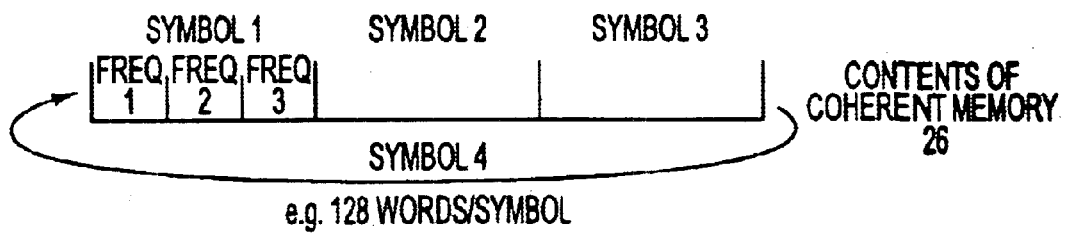
FIG. 13D shows the contents of the coherent memory when storing three of the symbols of FIG. 13C.

If a given symbol of interest is longer than 32 chips then multiple additions can be made to the same symbol stored in the coherent memory 26. Each symbol can comprise many words. As an example, consider the case shown in FIG. 13C, wherein a first symbol (Symbol 1) is correlated for three different frequencies with possibly multiple delays for each frequency. FIG. 13D shows the contents of the coherent memory 26, wherein each symbol portion includes the three frequency portions. For example, the coherent memory may store 128 words per symbol. Thus, for the case of a 1024 word deep coherent memory, after the eight symbol is stored the memory will wrap around and begin to store over the first symbol data.

Figure 15:
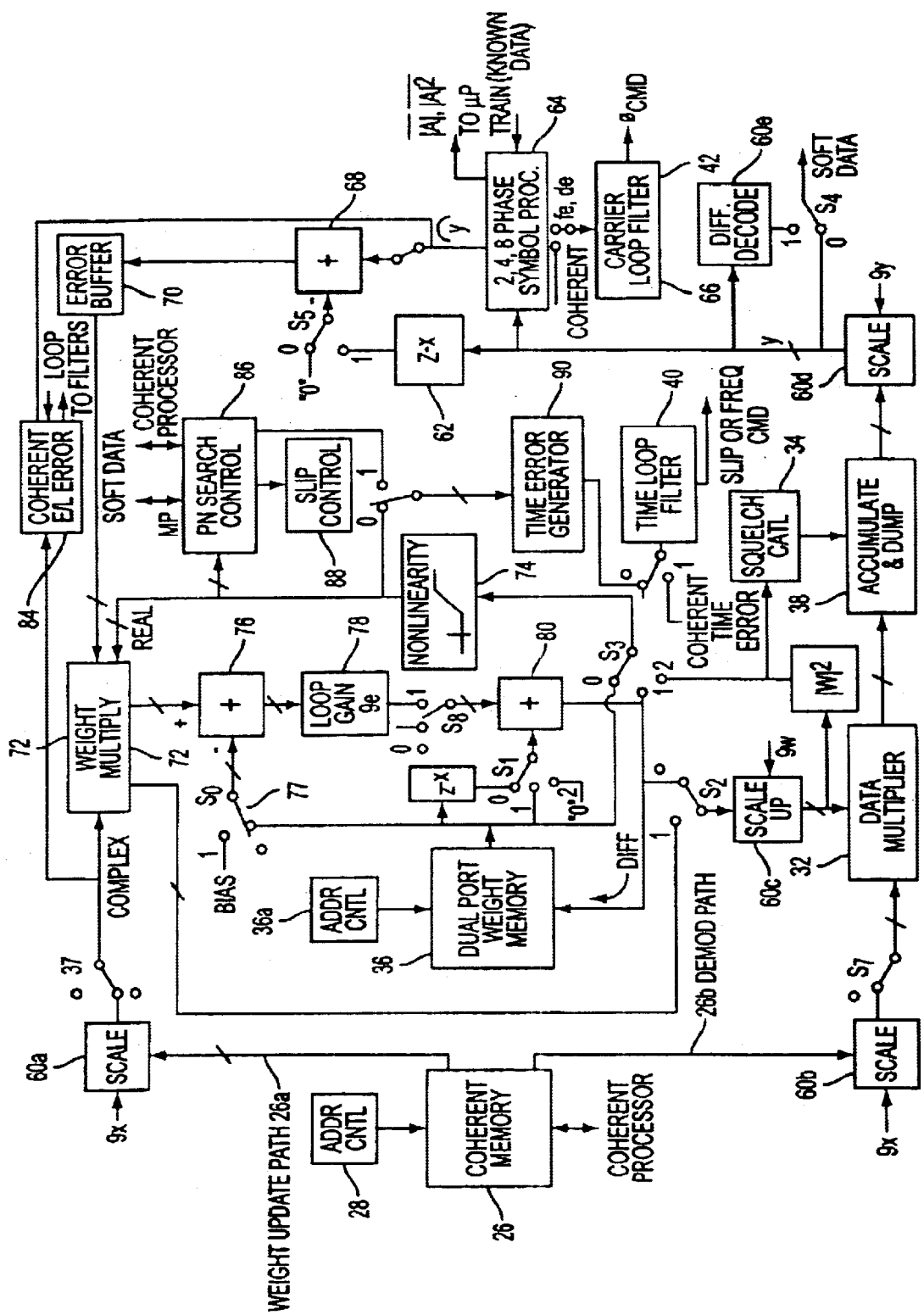
FIG. 15 is a block diagram of the sequential weight processor of FIG. 1B.

Reference is now made to FIG. 15 which shows, in greater detail, the sequential weight processor 30, multiplier 32, squelch 34, adaptive weight memory 36, weighted data accumulator 38, the synthesizer loop filter 40 and the carrier loop filter 42 that provides the phase command to the front end 12. All of these components are shown in the block diagram of FIG. 1B. FIG. 15 also depicts the input data paths from the coherent memory 26, specifically a weight update path 26a and a demodulator path 26b.

In general, these various blocks may be considered to be the adaptive weight processor and signal combiner which is a special purpose digital processor for adaptively weighting and combining multiple samples from a random access memory (i.e., the coherent memory 36) with weights from the adaptive weight memory. The adaptation and weighting are done sequentially over an output sample time. The adaptation algorithms are selectable from least mean square (LMS), channel estimator, and power. Additional processing to allow clump energy searching, weight initialization, and estimation of clump timing error, symbol state, carrier frequency error, and carrier phase error are also provided.

Scaler blocks 60a and 60b are responsive to a scale value command ($q_x$) to scale the output from the coherent memory 26 by a power of two. The output of the scaler 60b is 6-bit, twos complement complex data (coherent data samples) that undergoes a complex multiply in data multiplier 32 with processed and scaled data (6-bits from scaler 60c) from the adaptive weight memory 36. The result of the multiply is accumulated over some number of samples in the accumulate and dump block 38, is scaled back to 8-bits in scaler 60d before being output as the soft data decisions to, by example, a Viterbi decoder. The soft data is also applied to delay block 62, to a 2, 4, 8 phase symbol processor 64 (hard decision), and to a differential decoder 66. The symbol processor 64 can be trained using a known training sequence to substitute as an estimate of the transmittal symbol data from the soft data. This data estimate ŷ1 is applied in the channel estimator mode to an error block 68 and passed through to an error buffer 70. In the LMS mode the delayed soft decision data from block 62 is subtracted from the data estimate ŷ2 and the result placed in the error buffer 70. The error buffer .70 provides an input to a weight multiplier 72. The weight multiplier 72 multiplies the scaled output of the coherent memory 26 by the complex error signal from the error buffer 70, in one mode, or by real data output from a nonlinearity (range limiting) block 74 in another mode. The computation path between the weight multiplier 72 and the dual ported weight memory 36 includes summing blocks 76 and 80, loop gain multiplier 78, delay block 82, and various switches. The operation and various configurations of these various blocks are described in further detail below. A coherent early/late (E/L) error detector is also provided to derive timing loop filter inputs from the coherent memory input and the data estimate when only one coherent delay per symbol is available. A PN search control block 86, slip control block 88, and time error generator 90 are also provided.

Figure 16:
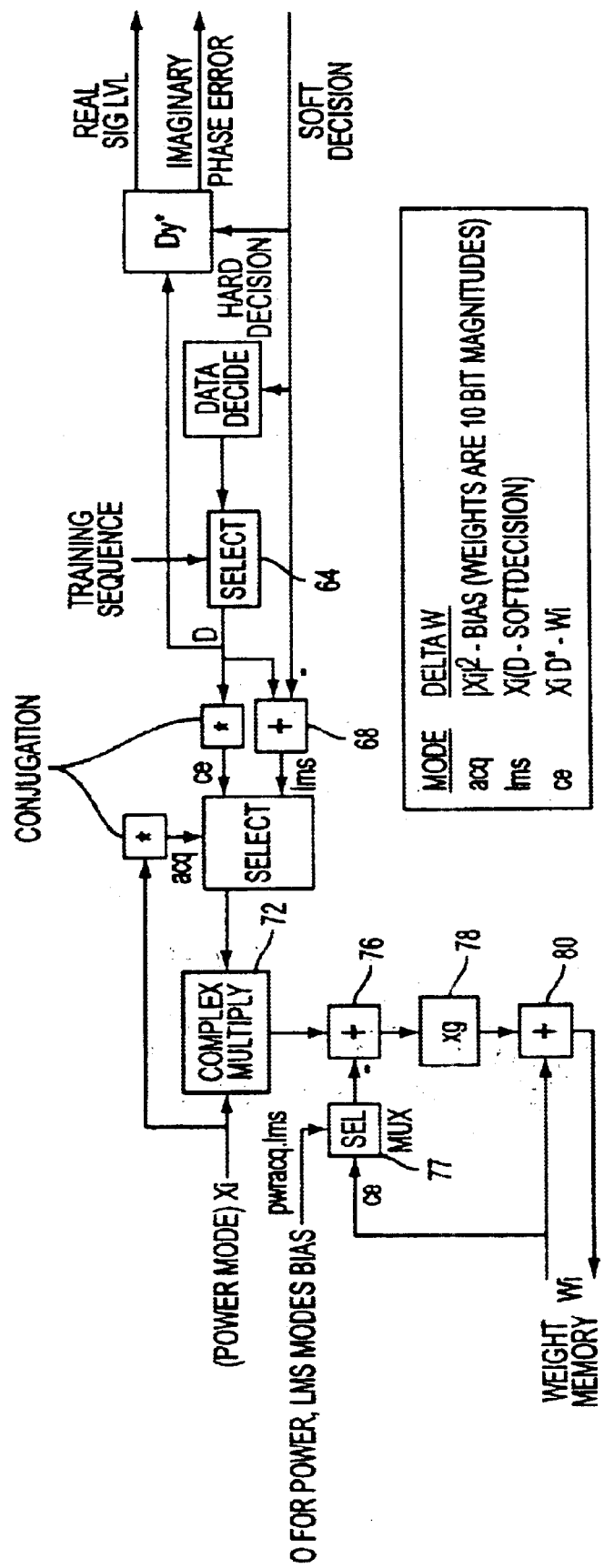
FIG. 16 is a simplified block diagram of a default configuration for the sequential weight processor of FIG. 15.
Figure 17A:
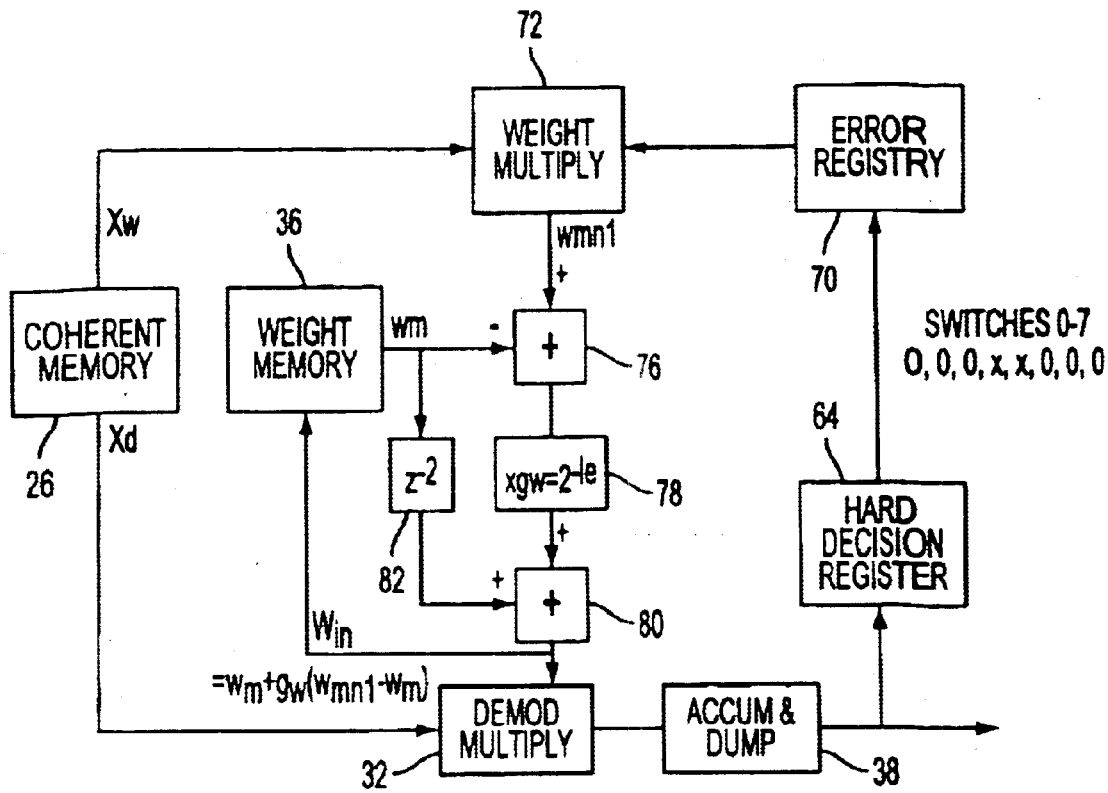
FIG. 17A is a simplified block diagram illustrating a channel estimator weight update configuration for the sequential weight processor of FIG. 15.
Figure 17B:
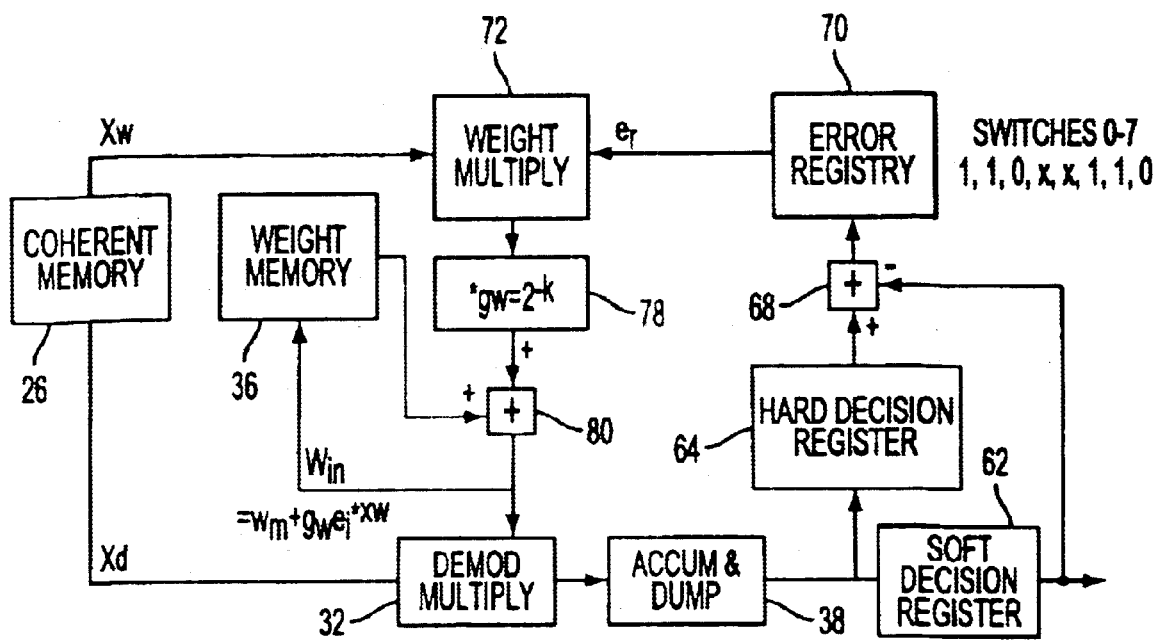
FIG. 17B is a block diagram illustrating an adaptive equalizer weight update configuration for the sequential weight processor of FIG. 15.
Figure 17C:
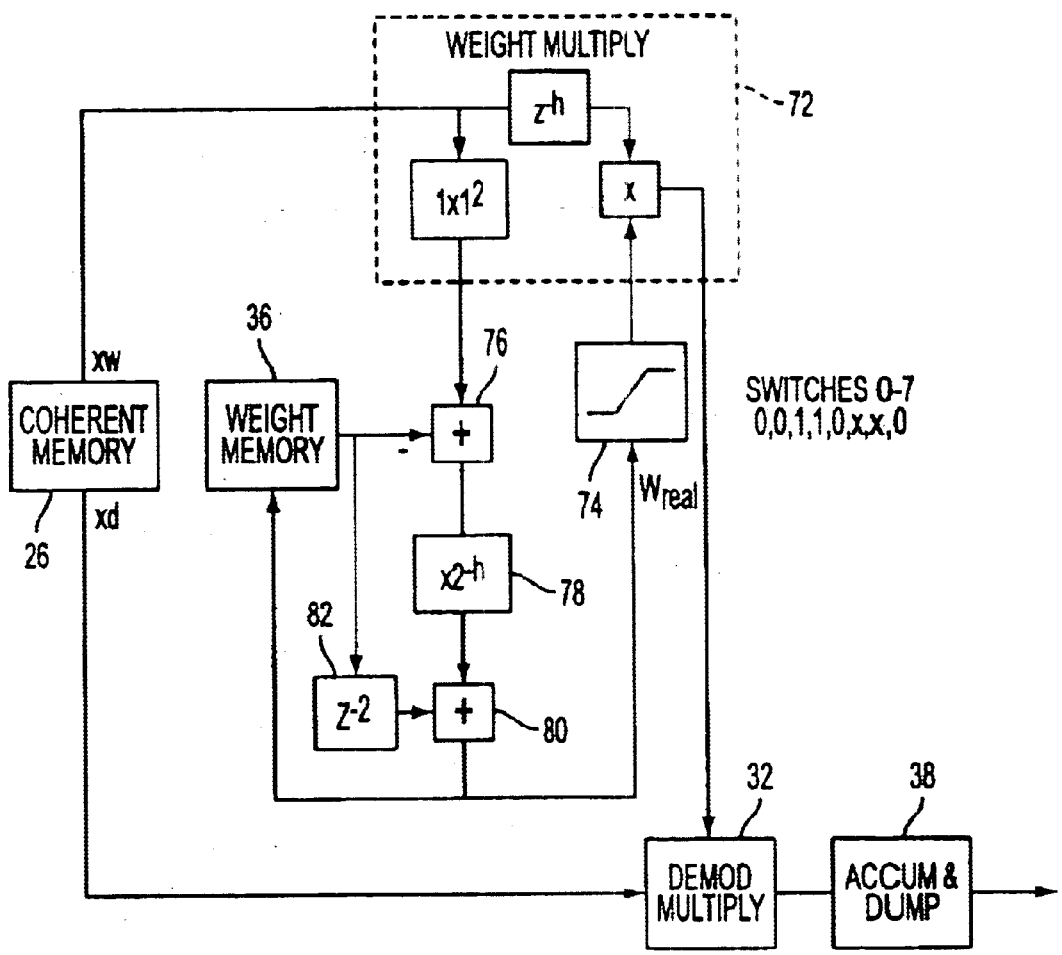
FIG. 17C is a block diagram illustrating a channel-wise differential weight update configuration for the sequential weight processor of FIG. 15.
Figure 17D:
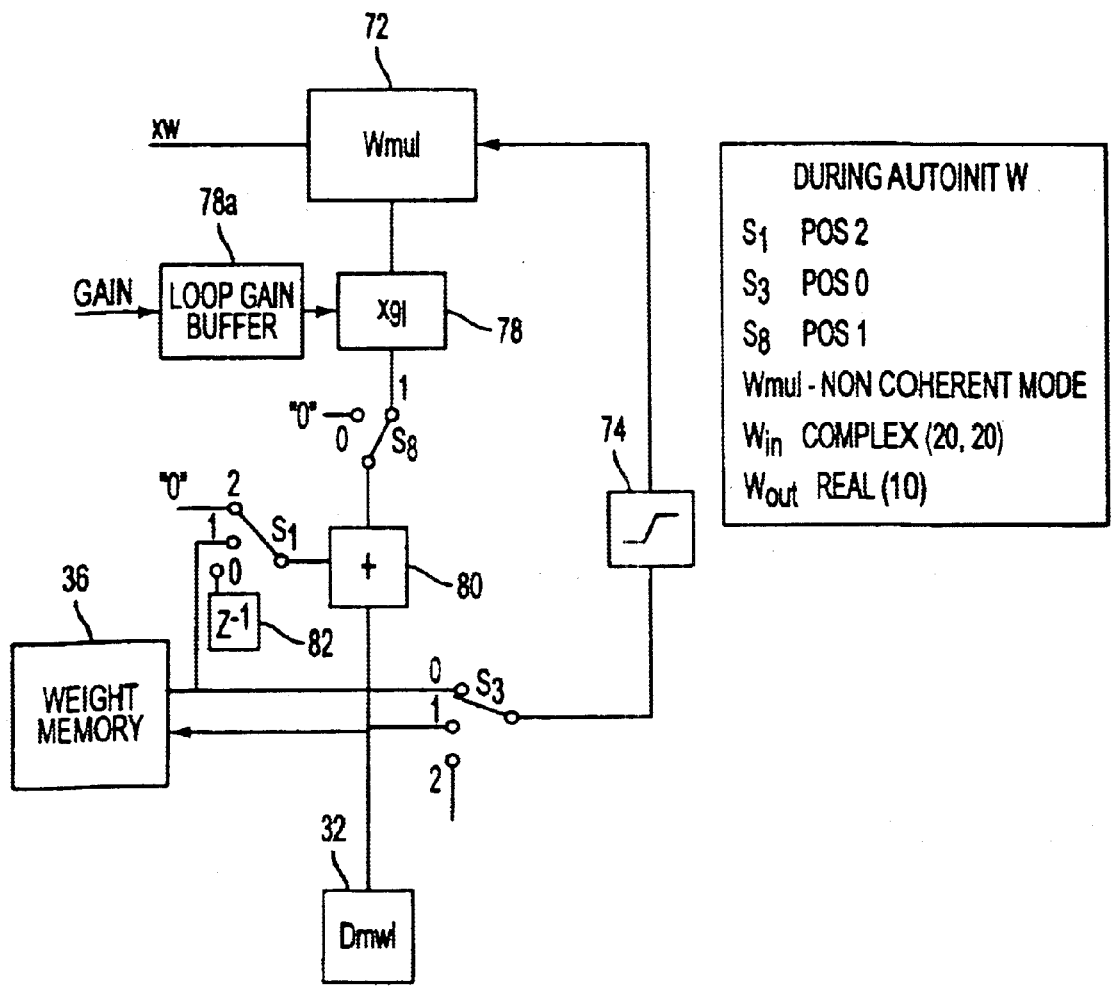
FIG. 17D is a block diagram illustrating a weight initialization configuration for the sequential weight processor of FIG. 15.

The various operating modes of the sequential weight processor 30 and related components are best understood by referring to FIGS. 16 and 17A–17D, wherein FIG. 16 is a simplified block diagram of a default sequential weight processor configuration, FIG. 17A is a simplified block diagram of a channel estimator (CE) mode weight update configuration, FIG. 17B is a simplified block diagram of an adaptive equalizer (AE) mode weight update configuration, FIG. 17C is a simplified block diagram of a channel-wise differential (CD) mode weight update configuration, and FIG. 17D is a simplified block diagram illustrating a weight initialization configuration (AutoInitW) for the sequential weight processor 30.

In further detail, FIG. 16 depicts the updated weight (Delta W) condition for each of the acquisition, LMS and channel estimator (CE) modes of operation. FIGS. 17A–17D also indicate the required states of switches S0–S5 shown in FIG. 15 (X indicates "don't care") in order to place the sequential weight processor 30 into the desired modal configuration. Note that in FIG. 17D the loop gain buffer 78a, which forms a part of the loop gain multiplier 78, is shown for completeness. The weight initialization procedures are described in further detail below. Blind equalization modes are implemented by performing a hard symbol estimation, instead of using a training sequence, to rectify weight update samples or produce error signals. As long as reliable symbol decisions can be made the performance is nearly equivalent to that obtained when using a training sequence. The blind equalization however presents difficult acquisition and fade recovery problems. For this reason a weight initialization algorithm is preferred.

One suitable weight initialization algorithm sets the weights to the conjugate channel levels for a single symbol, weighted by a nonlinear function of the measured power in that channel:

Wi=NL(Pi)*conj(Xi)

The non-linearity NL(x) is implemented as zero below a threshold and sloping from zero with the slope of the input to an upper limit. The upper and lower fixed limits represent theoretical asymptotes. Power below a given level would indicate no signal and thus zero weight, and power above a threshold SNR requires a weight proportional to signal level (Xi) and thus a fixed weight.

The measured power in each channel is the non-coherent weight value from either acquisition or a pseudo acquisition power measuring pass.

The initialization procedure occurs in a single symbol time when the non-coherent weights are read from the weight memory 36, nonlinearly multiplied by the data sample in the weight multiplier 72, scaled, and stored back into the weight memory 36 as coherent complex weights.

After this is accomplished a delay is counted until data decisions from these initial weights are available for a weight update. If the initial weights are sufficiently close that the error probabilities are small, the weights will converge to steady state values.

If the initial weights are far from correct the convergence can require a considerable time. A failed signal presence detection after a specific time should cause another weight initialization. If sufficient weight memory exists so that the previous power measurements are intact, and they are still valid, the previous power measurements can be used for the re-initialization, otherwise the power measurement must be redone.

After an acquisition or power measurement, the external controller (e.g., a microprocessor) sets up a weight initialization by specifying parameters, setting AutoInitW, and then asserting Track Mode. The weight processor 30 will initialize the weights, clear AutoInitW, delay a specified number of symbols until decisions on the initialized weights are being made, and then close the weight update loop.

Note that if training sequences can be used the weights are best initialized to zero and the weight update loop closed. Data decisions cannot be made until the weights grow sufficiently to have an impact on the demodulator multiply.

One method of tracking a correlation clump at high PN rates without a Direct Digital Synchronizer (DDS) is by a process referred to herein as synchronous slipping. The weight tracking tracks changes in correlation because of Doppler and local oscillator (LO) offsets. When a time error signal builds to more than ½ chip a synchronous slip is performed. The slip must be synchronous so that no data is lost during the slip. This requirement is complicated by the fact that several symbols may be processed in parallel, some at the old slip and some at the new slip.

Synchronous advancing is much more difficult not only because of PN advance problems but also because time is lost and extra clocks for the advance may not be available. Weight ring compensation for the advance is more difficult because of the sequence in which weights are presented. It is thus preferred to run the local clock at the maximum expected frequency, and to perform only synchronous slips.

Synchronous slips are initiated when the error signal from the time loop filter 40, configured as a low pass filter, exceeds a threshold value. A signal SSlipCmd synchronous with symbol timing and exactly one symbol long is sent to the coherent processor to initiate a single slip. This command will result in correlations in coherent memory 26 being some number of channels per chip (1 or 2) addresses lower. Synchronous with the SSlipCmd signal a SlipDelay counter is set to a programmable initial value. This counter is counted down at the symbol rate, and when it reaches a programmed threshold the next symbol used for demodulation (xd) has been slipped by the coherent processor.

When SlipDelay reaches 1 it indicates the next symbol of the coherent memory 26 used for weight update (xw) is slipped, and it is time to update the weight memory 36. The special treatment of xd is stopped. For this symbol time the weight output address is initialized to (Woutaddr)+3 channels per chip instead of Woutaddr0. These weight outputs then match the delayed inputs from xw coherent memory. All that remains is to initialize the weight corresponding to the new channel shifted in. Another counter is needed to count Nwght clocks from woutstb to initialize wout to zero for the new value channel.

Upon detecting SSlipCmd synchronous with the start of a new symbol, PN and PN-related timing is inhibited for one PN time. The input data is allowed to pass through the FIR filter 14 without interruption. This essentially provides a slip of the PN timing with respect to the input data. When extra clock cycles are used to extend the number of channels, some of the weights can correspond to pre-slip time and other weights to post-slip time. This is accommodated by shifting old weights identically to the way they are shifted to accommodate long matched filter (MF) times. Essentially the deleted PN cycle is compensated by shifting the old weights. The mask 18 must also be compensated for this shift. For all weights in the weight ring 16 corresponding to pre-shift PN's the mask start and mask end are incremented by one to follow the compensating shift.

The RADIS PN search simultaneously searches blocks of delays and frequencies as determined by the coherent processor 26 setup. A sequential search algorithm is employed whereby tests are made after every data symbol. If the test fails the search is stopped with no detect. If it passes the next symbol is processed. This continues until test failure or a preset number of symbols have been processed. If all symbols have been processed with no failure a final, possibly different, test is performed. Only if it passes is a detect condition declared and the test ends. The microprocessor/controller will determine the next process (regarding slip, or search, initialize weights, or track.)

For the case of a single channel sequential search, each coherent symbol correlation is used when completed. For each channel the magnitude squared minus a bias is accumulated, and the accumulation is performed as a real, low resolution weight with an initial bias. If all channels are represented in a symbol time and all channels are less than zero, the test fails and the search stops. If N symbols are counted without a slip a search end command initiates the final test.

For the final test a multi-channel test is performed. The real weights accumulated during the sequential search are used to determine if a correlation has been found. N tests with M channels per test are performed. A test includes passing the weights from M contiguous channels through the non-linearity block 74 and accumulating the result from an initial bias. If the accumulation is greater than zero a detect condition is declared and the search is stopped. The time error processor 90 contains the detect position (peak, median or mean mode). If no detect occurs the weight address is incremented in block 36a by a commanded amount and another test is performed. If N tests are performed with no detect, a slip is declared by the time loop filter 40.

A multi-channel sequential search can be accomplished if sufficient clock cycles are available. The weight memory 36 is built identically to the single channel sequential search described above. After the weight memory 36 is updated with all symbol data, a strobe initiates a signal detect sequence identical to the multi-channel test described above. If the signal detect is true, then the next symbol is identically processed until a search end condition, where passing a final test declares a signal detect condition. If the test is false the search is stopped without detect.

As with the single channel sequential search, the multi-channel search can take the coherent data directly from the coherent memory 26 input. This allows more channels to be searched without data loss from overwriting. The symbol time must be long enough to allow updating of all channels with the symbol data, and then performing the multi-channel search. An alternate non-immediate mode is provided that retrieves the symbol data from the coherent memory 26. An overwrite is more likely but the weights can be updated at one clock per channel, reducing the required symbol time to complete the test.

While described in the context of specific embodiments of memory sizes and storage capacities, numbers of bits and word widths, specific binary representations and the like, those skilled in the art should realize that a number of modifications to these and other parameters could be made without departing from the teachings of this invention.

Furthermore, certain of the components shown in FIG. 1B could be provided off-chip, for example the coherent memory 26 and/or the weight memory 36, although at the cost of increased numbers of I/O pins and possible degradation in access time and performance.

Furthermore, while parallel demodulation has been described in the specific context of a particular demodulator integrated circuit it will be understood by those skilled in the art that other types of demodulator circuits could be similarly used in the parallel fashion described above.

Thus, while the invention has been particularly shown and described with respect to preferred embodiments thereof, it will be understood by those skilled in the art that changes in form and details may be made therein without departing from the scope and spirit of the invention.

What is claimed is:

1. A high speed demodulator system comprising:
   an analog to digital converter (ADC);
   a high speed demultiplexer connected to an output of the ADC;
   a bank of parallel programmable demodulators connected to an output of the high speed demultiplexer;
   a timing interface connected to the bank of parallel programmable demodulators, the timing interface providing signal timing information to a first demodulator in the bank of demodulators, the first demodulator adapted to output a signal to the analog to digital converter for controlling a frequency and timing of the analog to digital converter to allow the bank of demodulators to lock on and track a received signal; and
   a phase reference interface connected to the bank of parallel programmable demodulators and a data processor to provide phase information on phases of demodulated data from each demodulator, each demodulator tracking a different phase of the received signal.

2. A high speed demodulator system as in claim 1, wherein the high speed demultiplexer further comprises:
   a demultiplexer operating at N times a received symbol rate, wherein N is equal to the number of parallel programmable ASIC demodulators in the bank.

3. A high speed demodulator system as in claim 1, wherein the bank of parallel programmable demodulators further comprises an array of programmable application specific integrated circuits (ASICs), wherein each ASIC further comprises an integrated circuit, comprising a reconfigurable multistage FIR filter having an input for receiving digital input signals and an output coupled to a coherent signal processor and a coherent memory for providing filtered signals thereto, the integrated circuit further comprising an adaptive weight processor having an input coupled to an output of said coherent memory, the adaptive weight processor comprising a weight memory and outputting symbol soft decision data resulting from processing the digital input signals.

4. A high speed demodulator system as in claim 1, wherein the timing interface further comprises a timing interface connected to an output of each of the parallel programmable demodulators, and to an input of at least one of the parallel programmable demodulators.

5. A high speed demodulator system as in claim 1, wherein the phase reference interface further comprises a phase reference connected to an output of each of the parallel programmable demodulators.

6. A high speed demodulator system as in claim 1, wherein the bank of parallel programmable demodulators further comprises an array of field programmable gate arrays.

7. The system of claim 1 wherein each demodulator comprises a rapid acquisition dispersive channel receiver integrated circuit demodulator.

8. The system of claim 1 wherein the timing interface is adapted to sample one sample per demodulated signal and provide signal timing information to a first demodulator in the bank of demodulators.

9. A method for acquiring information signals from an analog transmission signal, the method comprising steps of:
   receiving the analog transmission signal;
   mixing the analog transmission signal to produce a first analog signal and a second analog signal;
   digitizing the first analog signal to provide a first stream of digitized signals (I stream);
   digitizing the second analog signal to provide a second stream of digitized signals (Q stream);
   demultiplexing the I and Q streams of digitized signals to an array of programmable demodulators, the array of programmable demodulators having a first programmable demodulator, wherein each of the programmable demodulators further comprises an application specific integrated circuit (ASIC), comprising a reconfigurable multistage FIR filter having an input for receiving digital input signals and an output coupled to a coherent signal processor and a coherent memory for providing filtered signals thereto, the integrated circuit further comprising an adaptive weight processor having an input coupled to an output of said coherent memory, the adaptive weight processor comprising a weight memory and outputting symbol soft decision data resulting from processing the digital input signals.

10. A method according to claim 9, wherein the step of collecting and synchronizing the plurality of outputs of the array of programmable demodulators further comprises the steps of:

providing a phase reference interface between the plurality of outputs of the array of programmable demodulators and a data processor; and providing a timing interface between the plurality of outputs of the array of programmable demodulators and the analog to digital converter (ADC).

11. A method according to claim 10, wherein the step of providing the timing interface further comprises the steps of:

sampling the plurality of outputs of the array of programmable demodulators; and providing an error signal responsive to the sampled plurality of outputs of the array of programmable demodulators to the first programmable demodulator; and providing a correction signal from the first programmable demodulator to an analog to digital converter in response to the error signal.

12. A method according to claim 10, wherein the step of providing the phase reference interface further comprises the steps of:

sampling the phase of the plurality of outputs of the array of programmable demodulators; and providing phase reference information responsive to the sampling of the phase of the plurality of outputs of the array of programmable demodulators to the data processor.

13. A method according to claim 10 wherein the steps of collecting and synchronizing the output of the array of programmable demodulators further comprises the steps of:

connecting a data processor to accept a plurality of outputs of the array of programmable demodulators and a plurality of outputs from the phase reference interface; and reconstituting an information signal responsive to the plurality of outputs from the phase reference interface.

14. A method according to claim 9, further comprising the steps of:

digitizing an M number of the first analog signal and the second analog signal through an analog to digital converter (ADC) to provide an M number of the I stream digitized signals and an M number of the Q stream digitized signals, wherein M is equal to a received symbol rate;

providing the M number of the I stream digitized signals and the M number of the Q stream digitized signals to a demultiplexer;

demultiplexing the M number of the I stream digitized signals and the Q stream digitized signals at N times the received symbol rate to provide an array of N demultiplexed outputs, wherein N is equal to the number of the arrayed programmable demodulators; and providing the array of N demultiplexed outputs to the array of programmable demodulators.

15. A method according to claim 9, further comprising the steps of:

digitizing the first analog signal and the second analog signal through an analog to digital converter (ADC) to provide the I stream and the Q stream digitized signals;

providing the I stream digitized signals and the Q stream digitized signals to a demultiplexer;

demultiplexing the I stream digitized signals and the Q stream digitized signals at a multiple of the received symbol rate to providing an array of demultiplexed outputs, wherein the number of demultiplexed outputs is equal to the number of the arrayed programmable demodulators; and providing the array of demultiplexed outputs to the array of programmable demodulators.

16. A method of high rate demodulation of a series of modulated analog signals, the method comprising steps of:

acquiring and digitizing the series of modulated analog signals;

providing parallel programmable demodulation of the digitized series of modulated analog signals;

providing a plurality of parallel demodulated data; and reorganizing the demodulated data by providing a plurality of samples of the plurality of parallel demodulated data to a timing interface, a data processor, and a phase reference interface;

sequencing the plurality of parallel demodulated data provided to the data processor according to a plurality of controls provided by a phase reference interface;

controlling timing of at least one of a plurality of demodulator application specific integrated circuits (ASICs) responsive to the plurality of samples of the plurality of parallel demodulated data; and providing an output of at least one of the plurality of demodulator ASICS to an analog to digital converter.

17. A method according to claim 16, wherein the steps of acquiring and digitizing the series of modulated analog signals is further comprised of the step of:

digitizing the series of modulated analog signals through an analog to digital converter.

18. A method according to claim 16, wherein the step of providing parallel demodulation of the digitized series of modulated data is further comprised of the steps of:

sequentially demultiplexing the digitized series of modulated data to a plurality of parallel programmable application specific integrated circuits (ASIC) demodulators at a demultiplexer rate equal to the number of programmable demodulator ASICs; and demodulating the digitized series of modulated data to a plurality of parallel demodulated data.

19. A method according to claim 16, further comprising programming a bank of parallel programmable application specific integrated circuits (ASICs) demodulators to demodulate a received modulation type, wherein each ASIC further comprises an integrated circuit, comprising a reconfigurable multistage FIR filter having an input for receiving digital input signals and an output coupled to a coherent signal processor and a coherent memory for providing filtered signals thereto, the integrated circuit further comprising an adaptive weight processor having an input coupled to an output of said coherent memory, the adaptive weight processor comprising a weight memory and outputting symbol soft decision data resulting from processing the digital input signals.

20. A high speed demodulator system comprising:

an analog to digital converter (ADC);

a high speed demultiplexer connected to an output of the ADC;

a bank of parallel programmable demodulators connected to an output of the high speed demultiplexer comprising an array of programmable application specific integrated circuits (ASICs), wherein each ASIC further comprises an integrated circuit, comprising a reconfigurable multistage FIR filter having an input for receiving digital input signals and an output coupled to a coherent signal processor and a coherent memory for providing filtered signals thereto, the integrated circuit further comprising an adaptive weight processor having an input coupled to an output of said coherent memory, the adaptive weight processor comprising a weight memory and outputting symbol soft decision data resulting from processing the digital input signals;

a timing interface connected to the bank of parallel programmable demodulators; and a phase reference interface connected to the bank of parallel programmable demodulators and a data processor.

* * * * *